United States Patent [19]
Sentoku et al.

[11] Patent Number: 5,553,110
[45] Date of Patent: Sep. 3, 1996

[54] X-RAY MASK STRUCTURE, PROCESS FOR PRODUCTION THEREOF, APPARATUS AND METHOD FOR X-RAY EXPOSURE WITH THE X-RAY MASK STRUCTURE, AND SEMICONDUCTOR DEVICE PRODUCED BY THE X-RAY EXPOSURE METHOD

[75] Inventors: Koichi Sentoku, Kanagawa-ken; Kenji Saito, Atsugi; Keiko Chiba, Isehara; Hiroshi Maehara, Yokahama, all of Japan

[73] Assignee: Canon Kabushiki Kaisha, Tokyo, Japan

[21] Appl. No.: 345,395

[22] Filed: Nov. 18, 1994

[30] Foreign Application Priority Data

Nov. 19, 1993 [JP] Japan .................................. 5-312749
Nov. 19, 1993 [JP] Japan .................................. 5-312750
Nov. 11, 1994 [JP] Japan .................................. 6-301688

[51] Int. Cl.⁶ .................................. H01L 39/00
[52] U.S. Cl. .................................. 378/35; 378/34
[58] Field of Search .................................. 378/34, 35; 430/5

[56] References Cited

U.S. PATENT DOCUMENTS

| | | | |
|---|---|---|---|
| 4,735,877 | 4/1988 | Kato et al. | 430/5 |
| 5,178,977 | 1/1993 | Yamada et al. | 378/35 X |
| 5,291,536 | 3/1994 | Itoh et al. | 378/35 |
| 5,375,157 | 12/1994 | Maehara | 378/35 |

FOREIGN PATENT DOCUMENTS

| | | | |
|---|---|---|---|
| 0237613 | 9/1990 | Japan | 378/35 |
| 4130712 | 5/1992 | Japan | 378/35 |
| 4309212 | 10/1992 | Japan | 378/35 |
| 4372112 | 12/1992 | Japan | 378/35 |
| 5315228 | 11/1993 | Japan | 378/35 |
| 5315229 | 11/1993 | Japan | 378/35 |

*Primary Examiner*—David P. Porta
*Attorney, Agent, or Firm*—Fitzpatrick, Cella, Harper & Scinto

[57] ABSTRACT

An X-ray mask structure for X-ray lithography comprises a pattern, an X-ray transmissive film for holding the pattern, and a frame for supporting the X-ray transmissive film, wherein a light-scattering prevention film is formed on at least a part of the surface of the X-ray transmissive film and/or of the pattern, and the light scattering prevention film may be a flat coating film formed on at least one of the top face and the back face of the X-ray transmissive film and having a refractive index substantially equal to the refractive index of the X-ray transmissive film. A process for producing the X-ray mask structure comprises steps of forming a flat coating film having a refractive index substantially the same as that of the X-ray transmissive film on at least one of the top face and the back face of the X-ray transmissive film, and forming a pattern at least on the top face of the X-ray transmissive film. An X-ray exposure apparatus comprises an X-ray source, and the X-ray mask structure, and conducts transcription of the pattern formed on the x-ray mask structure onto a transcription-receiving member by projecting X-rays through the X-ray mask structure to the transcription receiving member.

15 Claims, 24 Drawing Sheets

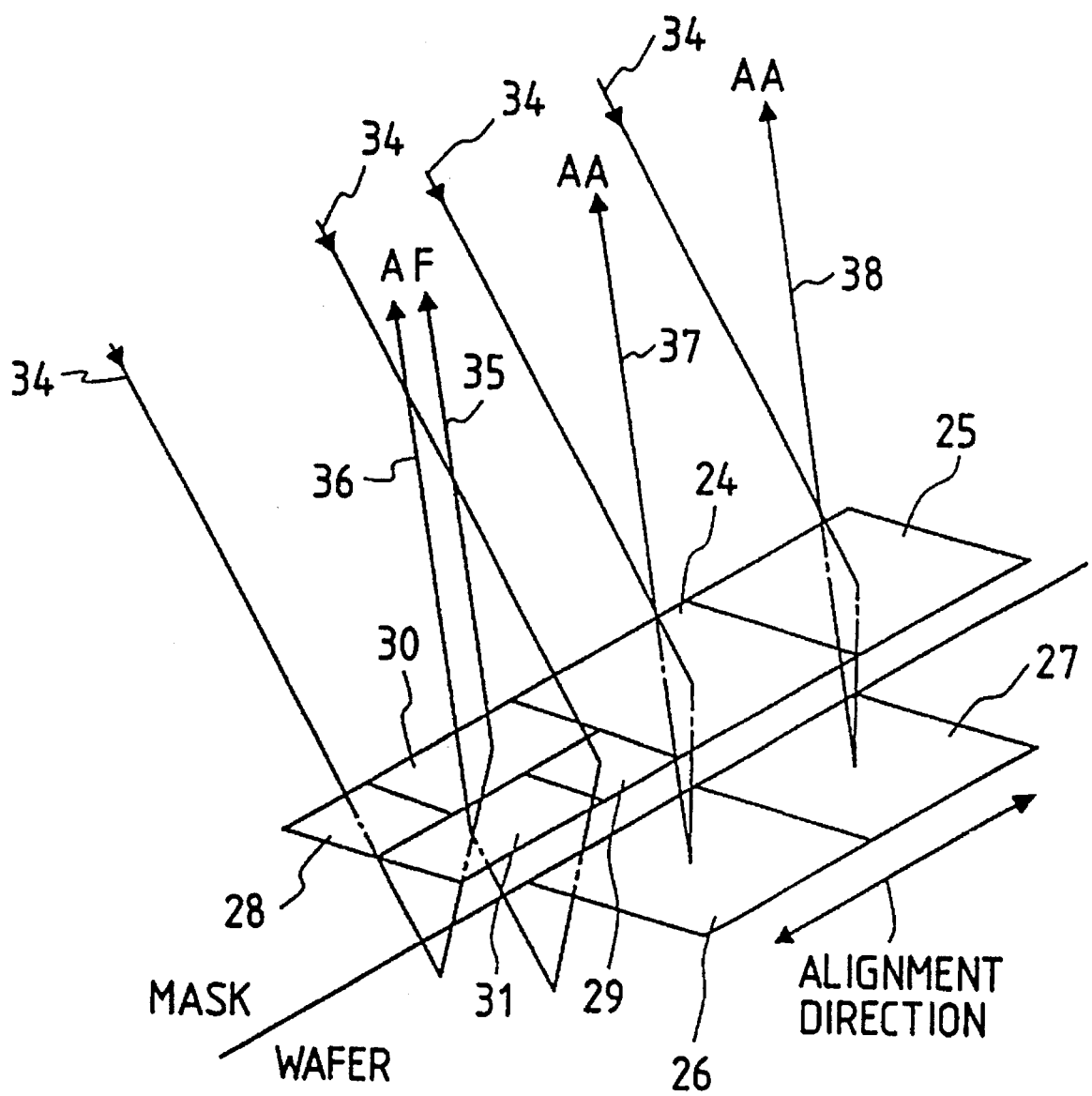

X-RAY MASK STRUCTURE, PROCESS FOR PRODUCTION THEREOF, APPARATUS AND METHOD FOR X-RAY EXPOSURE WITH THE X-RAY MASK STRUCTURE, AND SEMICONDUCTOR DEVICE PRODUCED BY THE X-RAY EXPOSURE METHOD

BACKGROUND OF THE INVENTION

1. Field of the Invention

The present invention relates to an X-ray mask structure used for printing a fine pattern by X-ray exposure on a wafer for a large-scale integrated circuit (LSI), microoptics, and micromachines. The present invention further relates to a process for producing the X-ray mask structure, an X-ray exposure apparatus and X-ray exposure method employing the X-ray mask structure, and a semiconductor device produced by the X-ray exposure method.

2. Related Background Art

Large scale integrated circuits typified by DRAM are now in a mass-production period of 4 M (mega) DRAM, and are advancing rapidly to 16 M DRAM, and further to 256 M DRAM. With the progress, the minimum line width required for the semiconductor device is becoming smaller, on the order of a half micron or a quarter micron.

In the production of such a semiconductor device, a mask pattern is printed on a semiconductor substrate by use of light having a wavelength of near ultraviolet to far infrared. However, the printing line width practicable with such a wavelength of light is coming close to the limit. Further, shortening of the exposure light wavelength, and increase of the numerical aperture unavoidably results in a decrease of focal depth. Therefore, an X-ray exposure apparatus is being developed which utilizes light (2 to 20 Å) of an X-ray region as the exposure light wavelength. The lithography technique employing X-rays is promising for solving the above problems simultaneously.

The X-ray mask structure generally has an X-ray transmissive film formed on a suitable supporting frame, and thereon a fine pattern of an X-ray absorbing material or an alignment pattern for use for alignment.

The illustrations for producing the aforementioned X-ray mask structure are shown below.

A first illustration, which is characterized by a flattening treatment of the X-ray transmissive film, is described by reference to FIGS. 21A to 21G.

Firstly, X-ray transmissive films 12a and 12b are formed on a top face and a back face of an Si substrate 11 as shown in FIG. 21A. An SiC or SiN film formed by a chemical vapor deposition (CVD) or the like method, for instance, is used as the X-ray transmissive film. Such a film is crystalline and has a fine surface roughness as shown in the drawing schematically. The surface roughness is disadvantageous to meet the requirements for high performance of semiconductor devices.

Then, the central portion of the X-ray transmissive film 12a on the back face of the Si substrate 11 is etched to leave the peripheral portion of the X-ray transmissive film 12a to form a ring-shaped film 12c as shown in FIG. 21B.

The central portion of the Si substrate 11 is etched by using the ring-shaped film 12a as the mask to leave the peripheral portion 11a of the Si substrate 11 as shown in FIG. 21C.

Subsequently, as shown in FIG. 21D and FIG. 21E, the surface of the X-ray transmissive film 12b on the top face of the Si substrate 11 is subjected to a flattening treatment. In the flattening treatment, a flattening-treatment film 14 is formed on the X-ray transmissive film 12b as shown in FIG. 21D: for instance, an $SiO_2$ film as the flattening treatment film on an X-ray transmissive film composed of SiC. Then, the entire surface of the flattening treatment film 14 is etched uniformly such that the flattening treatment film 14 is completely removed from the upper surface of the X-ray transmissive film 12b as shown in FIG. 21E. When the flattening treatment film 14 has been completely etched off, the flattening treatment is completed to form a flattened X-ray transmissive film 12d.

Further, an X-ray absorbent film 15 is formed on the flattened X-ray transmissive film 12d as shown in FIG. 21F, and a pattern 15a of the X-ray absorbent film 15 is formed in a conventional manner. Thus, the entire process of the production of the X-ray mask structure has been finished to obtain an X-ray mask structure having a desired pattern.

A second and a third illustration are characterized by the formation of a pattern of an X-ray absorbing material. The second illustration concerns the formation of an X-ray absorption pattern by metal plating, and the third illustration concerns that by etching.

The second illustration is described by reference to FIGS. 22A to 22H.

Firstly, an X-ray transmissive film 42 is formed from silicon nitride or the like by chemical vapor deposition (CVD) on a silicon wafer 41 which has been polished on both faces and will serve later as the supporting frame, as shown in FIG. 22A.

Then, the silicon wafer 41 is etched from the backside to form a non-supported film portion of the X-ray transmissive film 42 in the region on which a pattern is to be formed as shown in FIG. 22B.

On the X-ray transmissive film 42, a Cr film 43, and an Au film 44 for a plating electrode are vapor-deposited in a thickness respectively of 5 nm and 50 nm continuously by an electron-beam (EB) deposition apparatus as shown in FIG. 22C.

On the metal film, a resist 45 is applied and a pattern of the resist is formed by an optical exposure means such as a stepper, or an electron-beam drawing apparatus as shown in FIG. 22D.

Into the gaps in the resist pattern, heavy metal 46 such as Au is deposited as shown in FIG. 22E, and thereafter the resist is stripped off.

Then, the uncovered electrode portion on the non-patterned area is treated for transparency by Au sputtering and chrome oxidation by $O_2$-RIE as shown in FIG. 22F to obtain an X-ray mask structure.

Finally, this substrate is bonded to a supporting frame 47 made of Pyrex glass, silicon carbide, titanium alloy, or the like with an adhesive 48, e.g., of epoxy type, as shown in FIG. 22G.

If the X-ray mask structure is to be held with a magnetic chuck on an X-ray exposure apparatus, a magnetic body 49 is further bonded to the mask frame 47 as shown in FIG. 22H.

The third illustration is described below by reference to FIGS. 23A to 23H.

Firstly, an X-ray transmissive film 52 is formed from silicon nitride or the like by chemical vapor deposition (CVD) on a silicon wafer 51, which has been polished on both sides and will serve later as the supporting frame, as shown in FIG. 23A.

Then, the silicon wafer 51 is etched from the backside to form a non-supported film portion of the X-ray transmissive film 52 in the region on which a pattern is to be formed, as shown in FIG. 23B. On the X-ray transmissive film, an etching stopper layer 53 and an X-ray absorption film 54 are respectively formed by sputtering as shown in FIG. 23C.

Further thereon, a resist 55 is applied such as an electron-beam resist like PMMA and a photoresist. A pattern of the resist is formed by an optical exposure means such as a stepper, or an electron-beam drawing apparatus as shown in FIG. 23D.

By use of this resist as a mask, the X-ray absorption film 25 is dry-etched to form a pattern as shown in FIG. 23E.

Then, the uncovered etching stopper layer 53 on the non-patterned area is removed to obtain an X-ray mask structure having a desired pattern on the X-ray transmissive film as shown in FIG. 23F.

Finally, this substrate is bonded to a supporting frame 56 made of Pyrex glass, silicon carbide, titanium alloy, or the like with an adhesive 57 such as of epoxy type as shown in FIG. 23G.

If the X-ray mask structure is to be held with a magnetic chuck on an X-ray exposure apparatus, a magnetic body 58 is further bonded to the mask frame 56 as shown in FIG. 23H.

In an X-ray lithography technique employing the above X-ray mask structure, precise positional registration is important between the X-ray mask structure and a substrate for light exposure.

FIG. 24 illustrates schematically an ordinary X-ray exposure apparatus employing an X-ray mask structure, having a synchrotron source 60 as the X-ray source, an X-ray reflection mirror 61 for spreading the X-ray beam in a vertical direction, an X-ray mask structure 62, and a silicon wafer 63 as a substrate for exposure.

FIG. 25 schematically shows positional registration of an X-ray mask to a wafer. In FIG. 25, reference numeral 22 denotes an X-ray mask structure; 23 denotes a substrate, a silicon wafer, to be exposed; 24 to 31 denote alignment patterns on the X-ray mask; 16 to 20, and 32 and 33 denote parts constituting an optical alignment system. In one method for the alignment, a light diffraction phenomenon in an alignment pattern is utilized.

Specifically, a special optical alignment system provided on a light exposure apparatus detects a positional deviation of the X-ray mask structure 22 from the wafer 23, the two of which are placed at an extremely small spacing of several μm to several tens of μm by utilizing the alignment patterns 24 to 31 written on the X-ray mask pattern structure 22 and an alignment pattern (not shown in the drawing) formed preliminarily on the silicon wafer 23. According to the detected deviation, the stage of the light exposure apparatus is driven to obtain precise alignment between the X-ray mask structure and the wafer.

After completion of the alignment, the pattern on the X-ray mask structure is transcribed onto the wafer by X-ray exposure. A semiconductor device or the like is produced with a plurality of X-ray masks and a usual semiconductor production process in such a manner.

The X-ray mask structure prepared by the above-described process involves disadvantages discussed below.

In the above first illustration of a production process of an X-ray mask structure, the etching conditions need to be set to make the etching rate of the treatment film 14 equal to that of the X-ray transmissive film 12b. An error in the condition setting may cause incomplete flattening of the X-ray transmissive film 12b. In particular, SiC as the X-ray transmissive film 12b cannot readily be flattened by the aforementioned flattening treatment because of the many grain boundaries appearing on the surface owing to the polycrystalline nature of SiC.

Therefore, when lithography is conducted with an insufficiently flattened X-ray transmissive mask structure, or when a substrate surface is worked by X-ray exposure through the mask structure, alignment light or an X-ray introduced to the X-ray mask structure is scattered at the surface of the insufficiently flattened surface. The scattered light partly enters the detector of the optical alignment system to lower the precision of the alignment to impair the precision of the working by X-ray lithography.

In the X-ray mask structure of the second illustration, the X-ray absorption pattern or the alignment pattern is formed, for instance, by crystal growth of an Au layer by metal-plating as shown in FIGS. 22A to 22H. Therefore, the crystal growth face, namely the top face of the pattern 46 has the fine roughness of a grain boundary of the Au crystal.

On the other hand, the lateral wall of the pattern, which is an accurate reproduction of the resist pattern 46 employed at the metal plating, also has fine irregularity caused by fine irregularity of the lateral wall of the resist owing to the instability of the stationary wave or of the EB exposure beam, dissolution rate variation in the resist development, and other causes. Furthermore, the back face of the X-ray absorption pattern also has fine irregularity caused by the surface roughness of the X-ray transmissive film or the underlying substrate.

In the case when an X-ray absorption pattern or the alignment pattern is formed by etching as mentioned in the third illustration shown in FIGS. 23A to 23H, the X-ray absorbent film 53, which is formed by sputtering of tantalum, tungsten or the like, has fine roughness on the surface, and the lateral wall of the X-ray absorption pattern formed by etching also has fine irregularity owing to pattern edge roughness after the resist process, etching conditions, and other factors. Further, the back face of the X-ray absorption pattern also has fine irregularity caused by the surface irregularity of the X-ray transmissive film or the underlying substrate.

When optical alignment is practiced with such an X-ray mask structure having fine roughness of the pattern placed close to the wafer by means of an X-ray exposure apparatus, the alignment light is scattered at the surface of an X-ray absorption pattern or an alignment pattern. This scattered light partly enters the detector of the optical alignment system to decrease the precision of the working by X-ray lithography, which is a serious problem.

This problem is described below in more detail by reference to FIGS. 27A to 27C. In the drawings, the numerals 501, 511, and 521 denote respectively a supporting frame of the X-ray transmissive film. FIGS. 27A to 27C show examples of the scattering modes of alignment light from an X-ray absorption pattern and an alignment pattern.

FIG. 27A shows scattering of incident alignment light at the back face of the pattern 503 (namely the face in contact with the X-ray transmissive film 502). The scattered light 506, after multiple reflection at the back face of the pattern or in the X-ray transmissive film 502, reaches the alignment light detector.

FIG. 27B shows scattering of incident alignment light 515 at the top face of a pattern 513 (namely the surface of the pattern confronting an exposure substrate 514). The scattered light 516, after multiple reflection between the surface of the wafer 514 and the X-ray absorption pattern 513 or the X-ray transmissive film 512, reaches the alignment light detector.

FIG. 27C shows scattering of incident alignment light 525 at the lateral wall of the pattern 523. This scattered light 526, after multiple reflection between the wafer 524 and the X-ray absorbent film or the X-ray transmissive film, reaches the alignment detector.

The scattered light as shown by the numerals 506, 516, or 526 in FIGS. 27A to 27C which enters the optical alignment system as shown by numerals 33a and 33b in FIG. 25 causes much noise in the necessary alignment signal as in FIG. 28A, which lowers the precision of the wave analysis for the alignment, causing a decrease of the alignment precision.

SUMMARY OF THE INVENTION

The present invention intends to provide an X-ray mask structure which solves the above problems, and is capable of realizing extremely fine lithography without light scattering on an X-ray transmissive film; and further, a process for producing the X-ray mask structure, an apparatus and a method for X-ray exposure with the X-ray mask structure, and a semiconductor device produced by the X-ray exposure method.

The present invention further intends to provide an X-ray mask structure which solves the problem of the scattering of alignment light by an X-ray mask pattern in practice of positional registration, with the alignment mechanism, of the X-ray mask structure to a substrate wafer to be exposed, and the problem of the resulting decrease of the alignment precision to realize excellent X-ray lithography; and further, a process for producing the X-ray mask structure, an apparatus and a method for X-ray exposure by use of the X-ray mask structure, and a semiconductor device produced by the X-ray exposure method.

According to an aspect of the present invention, there is provided an X-ray mask structure for X-ray lithography comprising a pattern, an X-ray transmissive film for holding the pattern, and a frame for supporting the X-ray transmissive film, wherein a light-scattering prevention film is formed on at least a part of the surface of the X-ray transmissive film and/or of the pattern.

According to another aspect of the present invention, there is provided a process for producing an X-ray mask structure comprising steps of forming a pattern at least on a top face of an X-ray transmissive film, and forming a flat coating film having a refractive index substantially the same as that of the X-ray transmissive film on at least one of the top face and/or the back face of the X-ray transmissive film.

According to still another aspect of the present invention, there is provided a process for producing an X-ray mask structure for X-ray lithography comprising a pattern, an X-ray transmissive film for holding the pattern, a frame for supporting the X-ray transmissive film, and a light-scattering prevention film formed at least on a part of the surface of the X-ray transmissive film and/or of the pattern, wherein the light-scattering prevention film is formed by monitoring light scattering caused by the substrate.

According to a further aspect of the present invention, there is provided a process for producing an X-ray mask structure, comprising steps of forming a pattern, and forming a light-scattering prevention film at least selectively on a part of, or the whole of the surface of the pattern.

According to a still further aspect of the present invention, there is provided an X-ray exposure apparatus, which comprises an X-ray source, the aforementioned X-ray mask structure, and conducts transcription of a pattern on the X-ray mask structure onto a transcription-receiving member by projecting x-rays through the X-ray mask structure to the transcription-receiving member.

According to a still further aspect of the present invention, there is provided an X-ray exposure method, comprising transcribing a pattern on the aforementioned X-ray mask structure onto a transcription-receiving member by projecting X-rays through the X-ray mask structure onto the transcription-receiving member.

According to a still further aspect of the present invention, there is provided a semiconductor device produced by a process comprising transcribing a pattern onto a transcription-receiving member formed on a substrate by the aforementioned X-ray exposure method, and subsequently working the substrate.

BRIEF DESCRIPTION OF THE DRAWINGS

FIG. 26 shows the arrangement of physical optical elements on an X-ray mask structure and a wafer, and optical paths of projected light and the diffracted light.

DESCRIPTION OF THE PREFERRED EMBODIMENTS

Figure 1A:
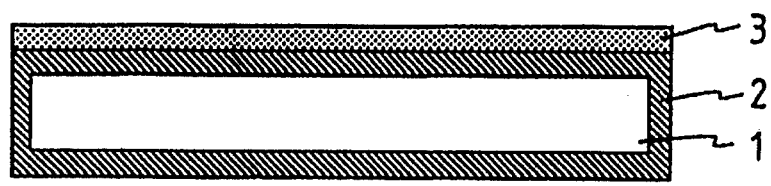
FIGS. 1A to 1E are schematic sectional views showing a process for producing an X-ray mask structure of the present invention.

A first embodiment of the present invention is described.

After a comprehensive investigation to solve the above problems, it was found by the inventors of the present invention that the light scattering at the surface of an X-ray transmissive film of an X-ray mask structure can be reduced remarkably by providing, as shown in FIGS. 1A to 1E, a light-scattering prevention film 3 or 7 on at least one of the top face and the back face of the X-ray transmissive film, thereby no etching step is required for flattening of the X-ray transmissive film surface, differently from conventional processes. Thus, the present invention has been accomplished. In the X-ray mask structure of the present invention, the light-scattering prevention film is kept covering the X-ray transmissive surface, and reduces greatly the scattering of projected light, in particular, of alignment light at the surface of the X-ray transmissive film.

The X-ray mask structure of the present invention has preferably a light-scattering prevention film (also called a flat coating film in the first embodiment) having substantially the same refraction index as the X-ray transmissive film on at least one of the top face and the back face of the X-ray transmissive film.

The material for the flat coating film having substantially the same refraction index as the X-ray transmissive film is not specially limited provided that the material is capable of reducing the scattering of the incident light at the surface of the X-ray transmissive film in combination with the X-ray transmissive film.

For instance, for an X-ray transmissive film formed from SiC (n=2.62), the material for the flat coating film is exemplified by CdS (n=2.6), ZnSe (n=2.58), and $TiO_2$, which have nearly the same refractive index as SiC. Such a material may be used singly or in combination of two or more thereof.

For an X-ray transmissive film formed from SiN, the material of the flat coating film is exemplified by $Nd_2O_3$, $Sb_2O_3$, $CeO_2$, and $TiO_2$. For an X-ray transmissive film formed from diamond, the material of the flat coating film is exemplified by $TiO_2$, ZnS, ZnSe, CdS, and $CeO_2$.

The above "substantially the same refractive index" of the flat coating film the X-ray transmissive film is not specially limited in the range since the allowable difference depends on the materials of the respective films. Generally, the flat coating film has preferably a refractive index in the range of ±10% of the refractive index of the X-ray transmissive film.

The refractive index of the films are measured at the wavelength of the light source of the alignment optical system.

The degree of flatness of the flat coating film, which is provided for reducing the light scattering at the surface of the X-ray transmissive film, is sufficient for the object of the present invention if the difference ($R_{max}$) of the height between the highest point and the lowest point in the cross-sectional curve of the flat coating film is not more than 10 nm.

The thickness of the flat coating film is not specially limited, but the film as the light scattering prevention film is required to cover the highest point of the irregularity of the surface of the X-ray transmissive film. The flat coating film may be formed on both the top face and the back face of the X-ray transmissive film or either one of the faces.

On the surface of the flat coating film, a light reflection prevention film may be provided to reduce the reflection of light introduced thereto in the present invention. The material of the light reflection prevention film includes $CeF_3$, $Al_2O_3$, $NdF_3$, $SiO_2$, and MgO.

The pattern formed on the X-ray transmissive film of the X-ray mask structure in the present invention includes an X-ray absorbing material pattern and an alignment marking pattern. In particular, in the present invention, noise generation by light scattering at the alignment marking pattern for positional registration of an X-ray mask structure to a wafer is greatly suppressed, thereby working precision in X-ray lithography being improved.

The principle of the positional registration of an X-ray mask structure to a wafer by the aforementioned X-ray exposure apparatus is explained by reference to FIG. 25. A light flux emitted from a light source 16, e.g., a semiconductor laser ($\lambda$=780 nm) and a He-Ne laser ($\lambda$=632.8 nm), etc., is converted to a parallel flux by a collimator lens 17. The parallel light flux is allowed to pass through a light-projecting lens 18, and to be deflected by a mirror 19, and to pass through a filter 20, and is projected to physical optical elements 24, 25, 26, and 27 for detecting relative lateral positional deviation and physical optical elements 28, 29, 30, and 31 for detecting relative spacing between an X-ray mask structure and a wafer 23 in an exposure range 21. The diffracted light from the physical optical elements contains information as to the lateral positional deviation and the relative spacing between the X-ray mask structure 22 and the wafer 23, and is allowed to pass through a filter 20, and to form an image by a light-receiving lens 32 on a light receiving face of the sensor 33. The sensor 33 is constituted of two line sensors 33a and 33b. The line sensor 33a receives diffracted light containing information about relative lateral positional deviation, and the line sensor 33b receives diffracted light containing information on relative spacing information between the X-ray mask structure 22 and the wafer 23.

FIG. 26 shows the arrangement of physical optical elements on the X-ray mask structure 22 and wafer 23, and optical paths of the projected light and the diffracted light. The physical elements for detection of relative lateral deviation between the X-ray mask structure and the wafer 23 are denoted by the numerals 24, 25, 26, and 27. The physical elements for detection of relative spacing between the X-ray mask structure 22 and wafer 23 are denoted by the numerals 28, 29, 30, and 31. The light 34 from the light source 16 is projected to the above-mentioned physical optical elements. The diffracted light beams 36, 37, 38, and 39 are directed to the sensor 33. The respective optical elements are constituted of a diffraction grating, a Fresnel zone plate, or the like.

Figure 28A:
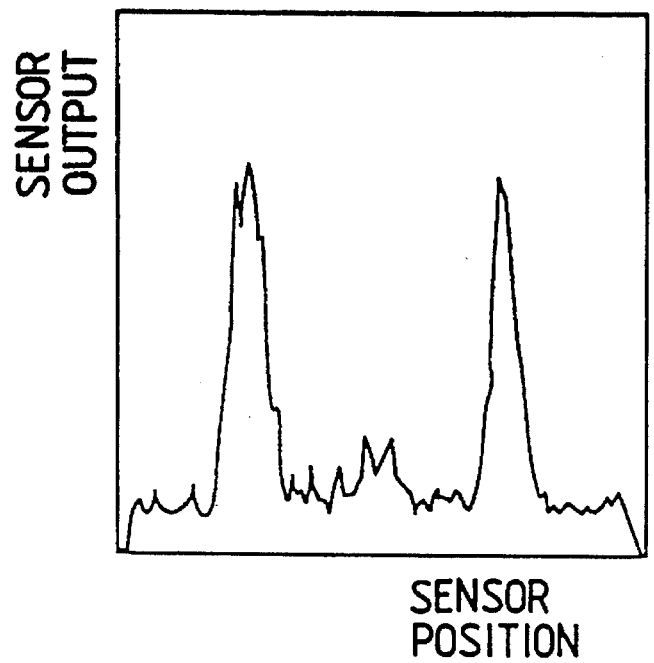
FIG. 28A shows an output signal from an alignment detection system for a Comparative Example.
Figure 28B:
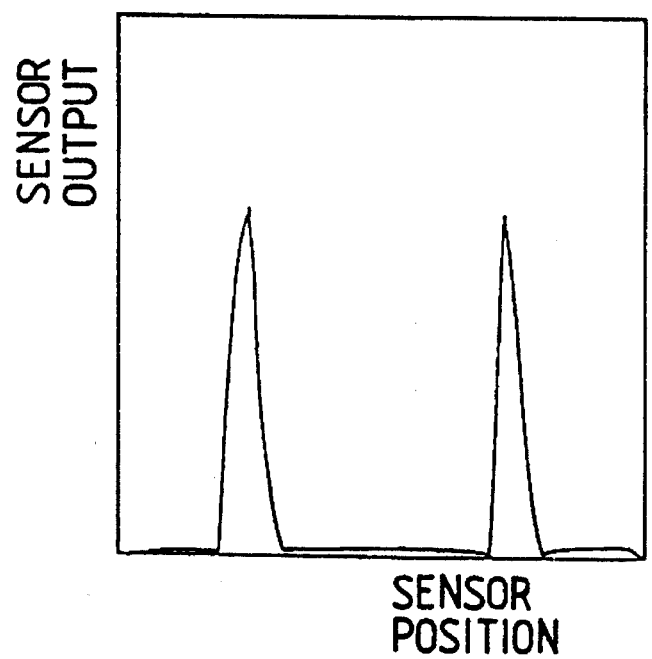
FIG. 28B shows that of the present invention.

FIGS. 28A and 28B show examples of the output from the line sensor 33a in FIG. 26 which has received the light signal on the relative lateral deviation of the X-ray mask structure 22 from the wafer 23. The relative spacing between the X-ray mask structure and the wafer is measured by the line sensor 33b precisely from the interval of the gravity centers of the two peaks. FIG. 28A shows the output of the sensor 33a in the case of an X-ray mask structure without a flat coating film for light-scattering prevention. FIG. 28B shows the output of the sensor 33a in the case of an X-ray mask structure of the present invention having a flat coating film for the light-scattering prevention. In FIG. 28B, the noise components caused by scattered light are remarkably reduced in comparison with the output in FIG. 28A. From the output value shown in FIG. 28B, the gravity centers of the peak positions can be determined precisely.

The relative lateral deviation and the relative spacing between the X-ray mask structure may also be measured by optical heterodyne interference with a linear diffraction grating or a checker grating as the measuring physical optical element.

A second embodiment of the present invention is described below.

It was found by the inventors of the present invention that a drop of alignment precision caused by scattering of alignment light by the pattern on an X-ray mask structure can be improved by forming a light-scattering prevention film on a part or the entirety of the pattern surface, and the present invention has been completed.

The X-ray mask structure of the present invention is characterized by a light-scattering prevention film formed on a part or the entirety of the surface of the pattern held on an X-ray transmissive film such as an X-ray absorption pattern or an alignment pattern. More specifically, a light-scattering prevention film is formed on at least a part or the entirety of the surface of an X-ray absorption pattern or an alignment pattern, in particular an alignment pattern for the purpose of preventing the scattering of light introduced into an X-ray mask structure. FIGS. 2A to 2H show a specific example of formation of such a light-scattering prevention film.

A first type of the light-scattering prevention film constituting the X-ray mask structure of the present invention includes those formed from a material capable of absorbing alignment light. The wavelength of the light employed for the alignment is exemplified by 633 nm light of a He-Ne laser, 785 nm light of a semiconductor laser, and a selected emission light, e.g., 546 nm light, of a mercury lamp. Therefore, the material for the alignment light-absorbent film needs to be selected according to the wavelength of the alignment light. The alignment light-absorbing material used for this purpose in the present invention includes carbon and organic dyes. The organic dyes may be any compound which is capable of absorbing the alignment light. The examples therefor include an indigo type dye represented by the formula (1), an anthraquinone type dye represented by the formula (2), cyanine type dyes represented by the formula (3), and the like. These materials may be laminated practically as the alignment light-absorbent layer by a conventional film forming method such as sputtering and vapor deposition.

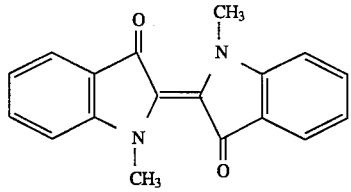
(1)

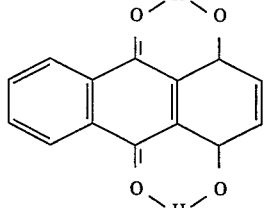
(2)

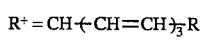

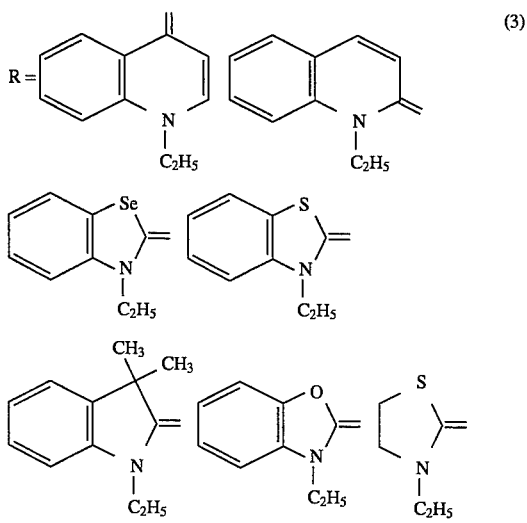
(3)

A second type of the light-scattering prevention film constituting the X-ray mask structure of the present invention includes films for reflection prevention of alignment light. No reflection prevention film formed on an X-ray absorption pattern or an alignment pattern is known until now for prevention of scattering of the alignment light, while formation of a reflection prevention film for the alignment light on the surface of an X-ray transmissive film can readily be thought of for improving transmissivity for the alignment light of the X-ray mask structure. However, the reflection prevention film formed on the metal pattern surface in the present invention is different in nature and in its light refractivity from the one formed on such an x-ray transmissive film, which is highly transmissive to alignment light or the like generally.

In general, light reflection at a metal surface cannot readily be prevented. However, in the case where an X-ray absorption pattern or an alignment pattern has a refractive index of not less than 1, the refractive index "n" of the material to be used for the light reflection prevention film in the present invention is given by Equation (1) below:

$$n=[n_0+\{k_0^2/(n_0-1)\}]^{1/2} \quad (1)$$

wherein $n_0$ is a real number portion of a complex refractive index of the material constituting the pattern, and $k_0$ is an imaginary number portion thereof.

For instance, when tungsten is used for forming an X-ray absorption pattern or an alignment pattern, $n_0=3.48$, and $k_0=2.79$, therefore from equation (1), n=2.57.

The reflection prevention film for the alignment light in the present invention may be made of any material which has the refractive index shown by the equation (1) or a slightly different refractive index from that. The refractive index of the material is preferably within the range of ±10%, more preferably ±5% of the value shown by the equation (1). The material having such a refractive index useful in the present invention includes specifically silicon carbide, zinc selenide, titanium oxides represented by $TiO_x$ and $Ti_xO_y$, cadmium sulfide, and the like.

Such a material is practically made into a reflection preventing film for alignment light by a usual thin film forming method like sputtering, chemical vapor deposition, resistance heating, electron beam vapor deposition, and so forth. The film is formed in a thickness d:

$$d = \lambda/4n$$

where $\lambda$ is the wavelength of the alignment light.

Figure 27A:
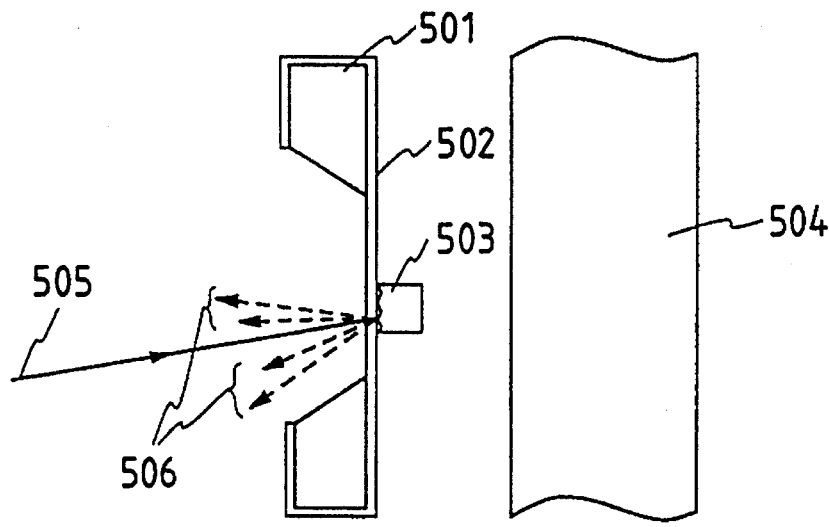
FIGS. 27A to 27C show scattering of alignment light on the X-ray mask structure.
Figure 27B:
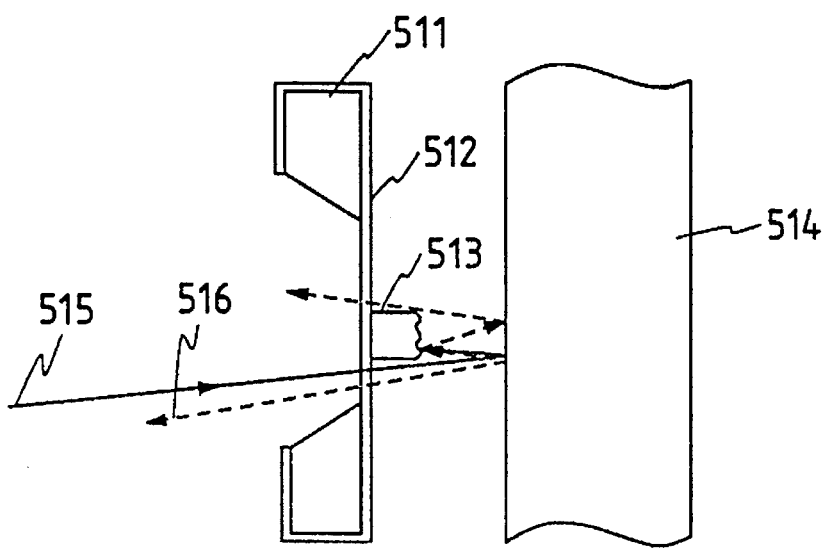
Figure 27C:
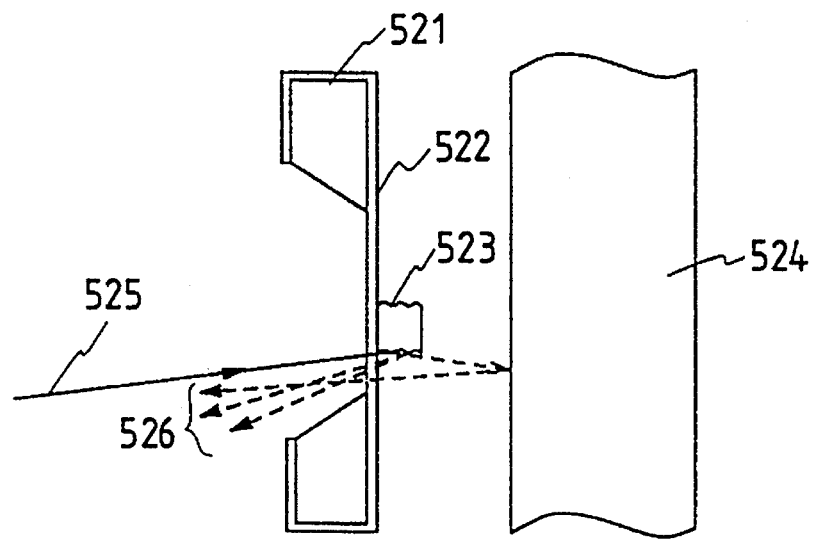

The position of formation of the light scattering prevention film is explained below. As mentioned before, the alignment light from the X-ray absorption pattern or the alignment pattern formed on the X-ray mask structure is scattered in a manner as shown in FIGS. 27A to 27C. Accordingly, the light scattering prevention film needs to be formed in correspondence with the pattern shown in FIGS. 27A to 27C. The position of the film formation is explained by reference to FIGS. 2A to 2H.

In the drawings, the shadowed portion denotes a light-scattering prevention film formed according to the present invention.

Figure 2A:
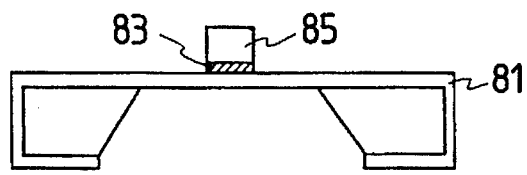
FIGS. 2A to 2H are schematic sectional views showing an arrangement of an alignment light-scattering prevention film of the present invention.

FIG. 2A shows a light scattering prevention film 83 formed between an X-ray absorption pattern or an alignment pattern 85 and an X-ray transmissive film 81. (The same numbers are given in each drawing.)

Figure 2B:
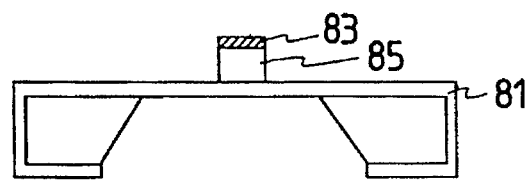

FIG. 2B shows a light scattering prevention film 83 formed on a top face of an X-ray absorption pattern or an alignment pattern 85, namely on the face confronting a face of a silicon wafer, a substrate for exposure.

Figure 2C:
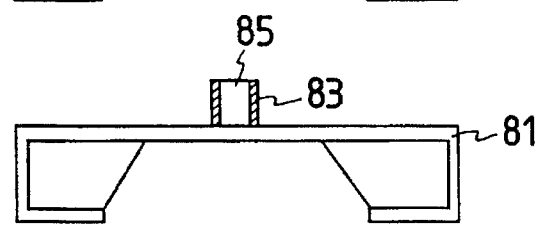

FIG. 2C shows a light scattering prevention film 83 formed on lateral faces of an X-ray absorption pattern or an alignment pattern 85.

Figure 2D:
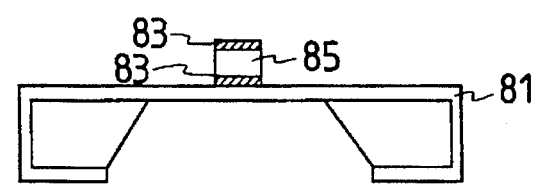

FIG. 2D shows a light scattering prevention film 83 formed on both a top face and a back face of an X-ray absorption pattern or an alignment pattern 85.

Figure 2E:
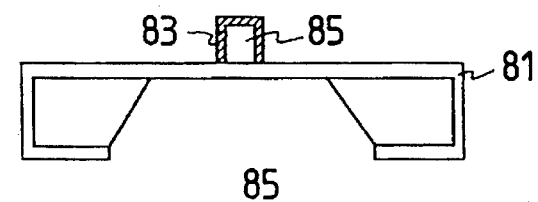

FIG. 2E shows a light scattering prevention film 83 formed on both a top face and lateral faces of an X-ray absorption pattern or an alignment pattern 85.

Figure 2F:
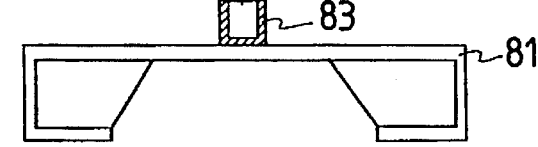

FIG. 2F shows a light scattering prevention film 83 formed on both a back face and lateral faces of an X-ray absorption pattern or an alignment pattern 85.

Figure 2G:
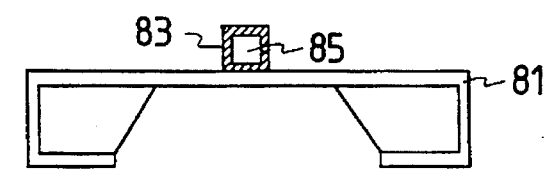

FIG. 2G shows a light scattering prevention film 83 formed on a top face, a back face, and lateral faces of an X-ray absorption pattern or an alignment pattern 85.

Figure 2H:
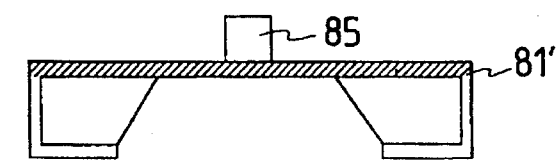

FIG. 2H shows an X-ray transmissive film 81' having by itself a controlled thickness to satisfy the conditions of prevention of reflection of an X-ray absorption pattern or an alignment pattern 85.

The light scattering prevention film formed as shown in any of FIGS. 2A to 2H may be any combination of a light reflection preventing film and a light absorbent film.

Further, the light scattering prevention film formed as shown in any of FIGS. 2A to 2H may be combinedly employed with a known conventional reflection preventing film of an X-ray transmissive film.

The present invention also provides an X-ray exposure apparatus which comprises an X-ray source and the above X-ray mask structure, and which transcribes a pattern from an X-ray mask structure onto a transcription-receiving member by projecting X-rays through the X-ray mask structure onto the transcription-receiving member.

The present invention further provides an X-ray exposure method, comprising conducting transcription of the pattern on the aforementioned X-ray mask structure onto a transcription-receiving member by projecting X-rays through the X-ray mask structure onto the transcription-receiving member.

The present invention still further provides a semiconductor device produced by a process comprising transcribing a pattern onto a transcription-receiving member formed on a substrate by the aforementioned X-ray exposure method, and subsequently working the substrate.

The present invention is described more specifically below by reference to examples.

EXAMPLE 1

FIGS. 1A to 1E are sectional views showing a process for producing an X-ray mask structure of Example 1 of the present invention. In FIG. 1A, a substrate 1 is a member for supporting an X-ray transmissive film, and is usually an Si wafer.

In this Example, an SiC film is first formed in a thickness of 2 μm as an X-ray transmissive film 2 by chemical vapor deposition (CVD) on a substrate 1, an Si wafer. The formed SiC film as the X-ray transmissive film 2 had a refractive index n=2.62. On the top face of the X-ray transmissive film 2, a CdS film (n=2.6) was formed as a flat coating film 3, serving as a light scattering prevention film, in a thickness of 120 nm by sputtering.

Figure 1B:
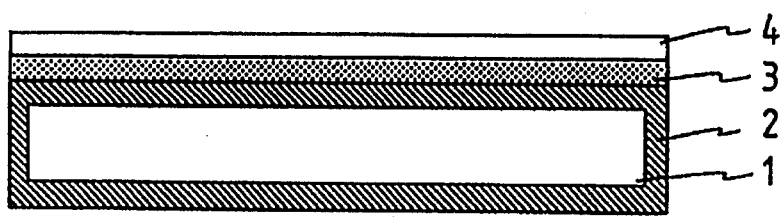

On the flat coating film 3, a tungsten film was formed as an X-ray absorbing layer 4 in a thickness of 750 nm by sputtering (FIG. 1B). Further, on the X-ray absorbing layer 4, an $SiO_2$ film was formed in a thickness of 50 nm by sputtering (not shown in the drawing).

On the $SiO_2$ layer, a chemical amplification resist which is an extreme ultraviolet resist was applied in a thickness of 0.3 μm. This substrate was exposed to light of 248 nm irradiated through a preliminarily prepared reticle with an excimer laser stepper of a numerical aperture of 0.5. By developing the resist, a resist pattern was formed at a resolution of 0.25 μm (not shown in the drawing).

Figure 1C:
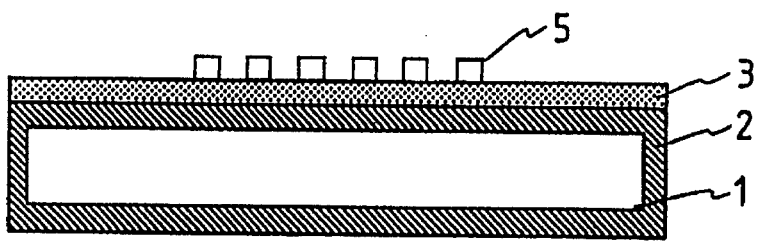

The $SiO_2$ layer was etched by use of the resist pattern as the mask, and the tungsten layer was dry-etched by use of the etched $SiO_2$ layer as the mask to form an X-ray absorption pattern 5 as shown in FIG. 1C and an alignment pattern (not shown in the drawing) in a thickness of 0.75 μm.

Figure 1D:
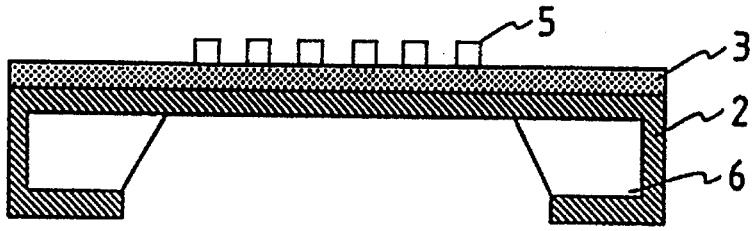

The X-ray transmissive film 2 on the reverse side on which the light-absorbing pattern was not to be formed was partly removed by dry etching in a portion which serves later as an X-ray transmitting area as shown in FIG. 1D. Then, the portion of the substrate 1 where the X-ray transmissive film 2 had been removed was etched off at 100° C. with an aqueous 30% potassium hydroxide solution to form a supporting frame 6.

Figure 1E:
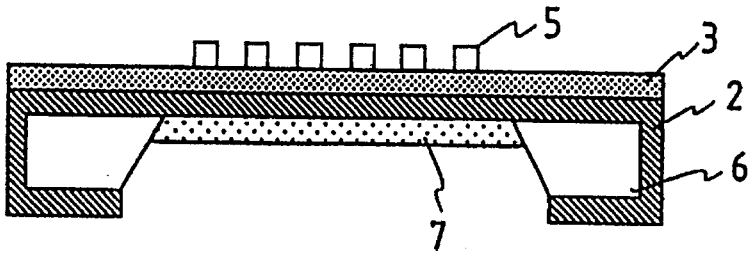

Finally, as shown in FIG. 1E, a flat coating film 7 as a light-scattering prevention film was formed from CdS in a thickness of 120 nm on the back face of the X-ray transmissive film 2 by sputtering of CdS, the same material as the flat coating film 3 for light scattering prevention on the top face. Thus, an X-ray mask structure of the present invention was prepared which has a flat coating film on both the top face and the back face of the X-ray transmissive film 2.

The material of the thin flat coating film 7 on the back face of the X-ray transmissive film 2 employed in this Example was CdS, which was the same material as the flat coating film 3 on the top face. However, the material may be different from the one for the flat coating film 3 on the top face, provided that it has substantially the same refractive index as that of the X-ray transmissive film 2, namely in the range of ±10% of the refractive index of the X-ray transmissive film. Naturally the material of the flat coating film 7 may be different from the material of the flat coating film 3.

Figure 25:
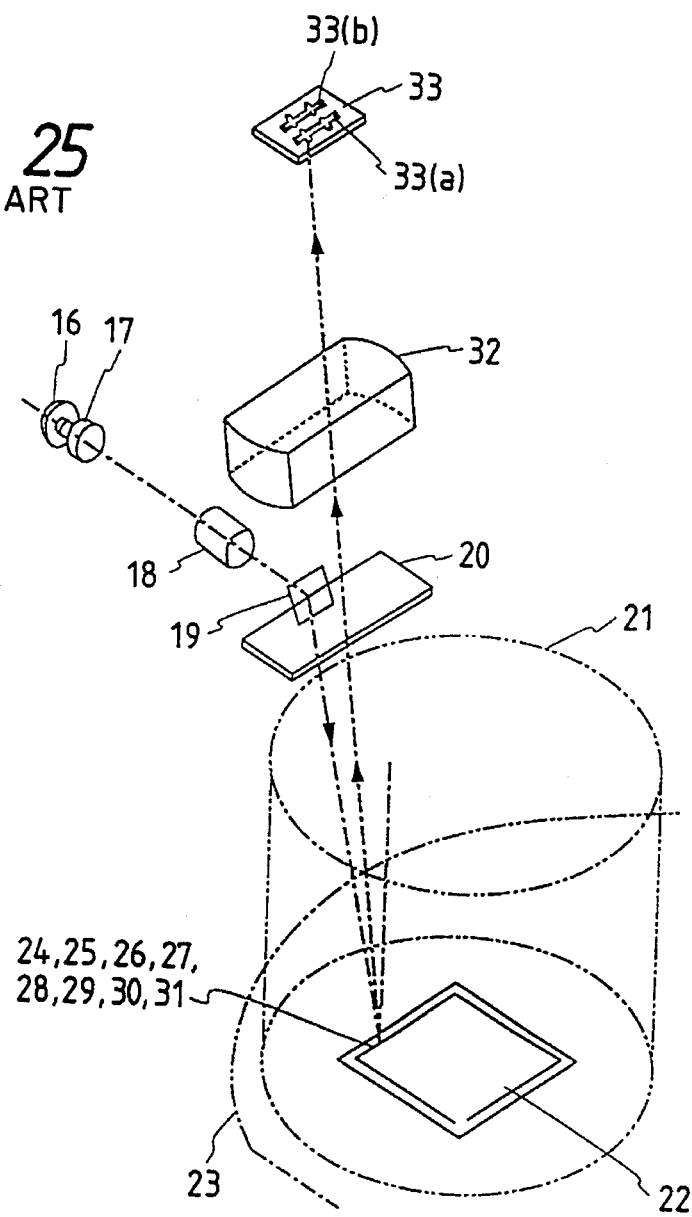

When the X-ray mask structure of Example 1 was used in an exposure apparatus as shown in FIG. 25 for positional registration of a mask to a wafer, light scattering on the surface of the X-ray transmissive film and reflection of the alignment light on the light-introducing mask face were reduced, and the noise components of the signal were reduced to enable high precision of the positional registration.

EXAMPLE 2

Figure 3A:
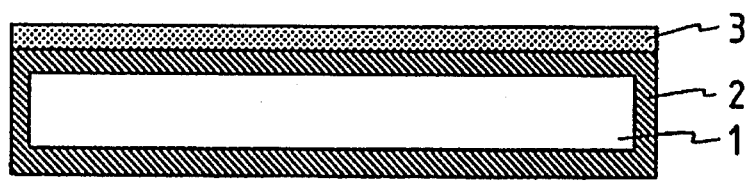
FIGS. 3A to 3F are sectional views showing a process for producing an X-ray mask structure of Example 2 of the present invention.

FIGS. 3A to 3F are sectional views showing schematically a process for producing an X-ray mask structure of Example 2 of the present invention. In FIG. 3A, a substrate 1 is a member for supporting an X-ray transmissive film, and is usually an Si wafer.

In this Example, an SiC film is first formed in a thickness of 2 μm as an X-ray transmissive film 2 by chemical vapor deposition (CVD) on a substrate 1, an Si wafer. The formed SiC film as the X-ray transmissive film 2 had a refractive index n=2.62. On the top face of the X-ray transmissive film 2, a ZnSe film (n=2.58) was formed as a flat coating film 3, serving as a light scattering prevention film, in a thickness of 120 nm by sputtering.

Figure 3B:
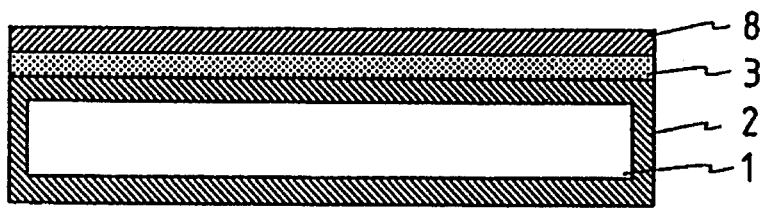

On the flat coating film 3, a $CeF_3$ film was formed as a reflection preventing film 8 in a thickness of 195 nm by anti-reflection coating (FIG. 3B).

Figure 3C:
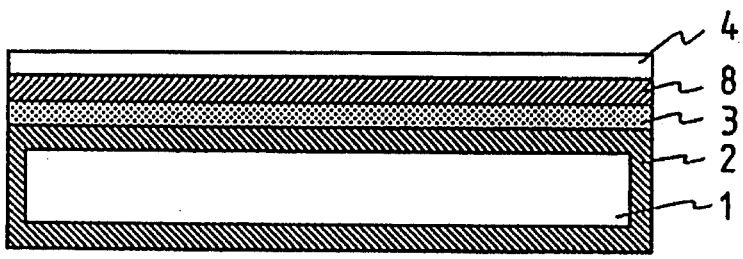

Further thereon, a tungsten film was formed as an X-ray absorbing layer 4 in a thickness of 750 nm by sputtering (FIG. 3C). Further, on the X-ray absorbing layer 4, an $SiO_2$ film was formed by sputtering (not shown in the drawing). On the $SiO_2$ layer, a chemical amplification resist which is an extreme ultraviolet resist was applied in a thickness of 0.3 μm.

This substrate was exposed to light of 248 nm projected through a preliminarily prepared reticle with an excimer laser stepper of a numerical aperture of 0.5. By developing the resist, a resist pattern was formed at a resolution of 0.25 μm (not shown in the drawing).

Figure 3D:
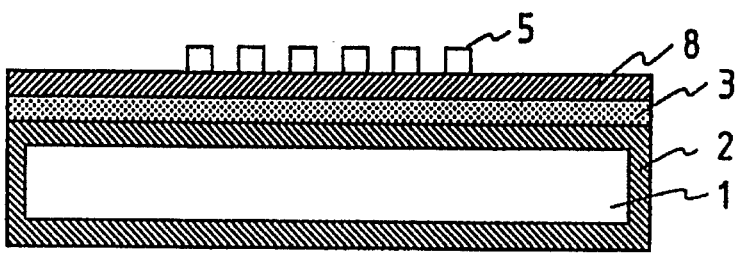

The $SiO_2$ layer was etched by use of the resist pattern as the mask, and the tungsten layer 4 was dry-etched by use of the etched $SiO_2$ layer as the mask to form an X-ray absorption pattern as shown in FIG. 3D, and an alignment pattern (not shown in the drawing) in a thickness of 0.75 μm.

Figure 3E:
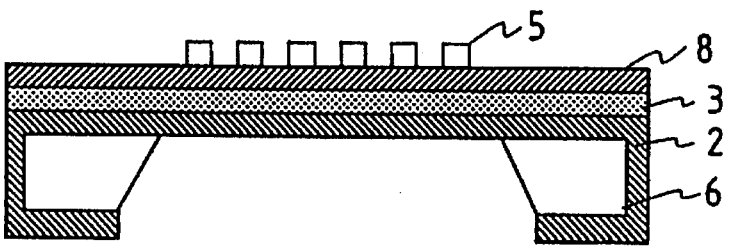

The X-ray transmissive film 2 on the reverse side, on which the light-absorbing pattern was not formed, was removed by dry etching in a portion which serves later as an X-ray transmitting area. Then, the portion of the substrate 1 where the X-ray transmissive film 2 had been removed was etched off at 100° C. with an aqueous 30% potassium hydroxide solution to leave a supporting frame 6 (FIG. 3E).

Figure 3F:
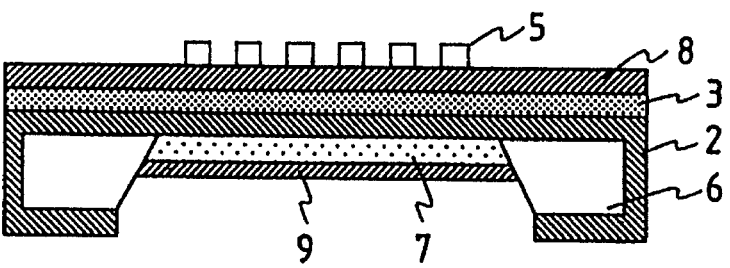

Finally, as shown in FIG. 3F, a flat coating film 7 which serves as a light-scattering prevention film was formed from ZnSe in a thickness of 120 nm on the back face of the X-ray transmissive film 2 by sputtering of ZnSe, the same material as the flat coating film 3 for light-scattering prevention. Further thereon, a $CeF_3$ film was formed as an anti-reflection coating film 9 in a thickness of 120 nm in the same manner as on the top face by sputtering. Thus, an X-ray mask structure of the present invention was prepared.

The material of the thin flat coating film 7 on the back face of the X-ray transmissive film 2 employed in this Example was ZnSe, which was the same material as the flat coating film 3 formed on the top face. However, the material may be different from the one for the flat coating film 3 provided that it has substantially the same refractive index as that of the X-ray transmissive film 2, namely in the range of ±10% of the refractive index of the X-ray transmissive film. Naturally, the material of the flat coating film 7 may be different from the material of the flat coating film 3. Although the scattering prevention film was formed on both faces in this Example, it may be formed on only one face of the X-ray transmissive film 2. The reflection preventing film may be formed on only one face.

When the X-ray mask structure of Example 2 was used in an exposure apparatus as shown in FIG. 25 for positional registration of a mask to a wafer, light scattering on the surface of the X-ray transmissive film and reflection of the alignment light on the light-introducing mask face were reduced, and the noise components of the signal were reduced to enable high precision of the positional registration.

EXAMPLE 3

An X-ray mask structure of the present invention was prepared in the same manner as in Example 1 except that SiN was used in place of SiC as the thin film forming material of the X-ray transmissive film 2, and $Nd_2O_3$ was used for the light-scattering prevention film. This X-ray mask structure was used in the same registration apparatus as in Example 1. Consequently, light scattering on the surface of the X-ray transmissive film and reflection of the alignment light on the light-introducing mask face were reduced, and the noise components of the signal were reduced to enable high precision of the positional registration as in Example 1.

EXAMPLE 4

An X-ray mask structure of the present invention was prepared in the same manner as in Example 1 except that diamond was used in place of SiC as the thin film forming material of the X-ray transmissive film 2, and $TiO_2$ was used for the light-scattering prevention film. This X-ray mask structure was used in the same apparatus for registration as in Example 1, and it was found that light scattering on the surface of the X-ray transmissive film and reflection of the alignment light on the light-introducing mask face were reduced, and the noise components of the signal were reduced to enable high precision of the positional registration as in Example 1.

EXAMPLE 5

Figure 4:
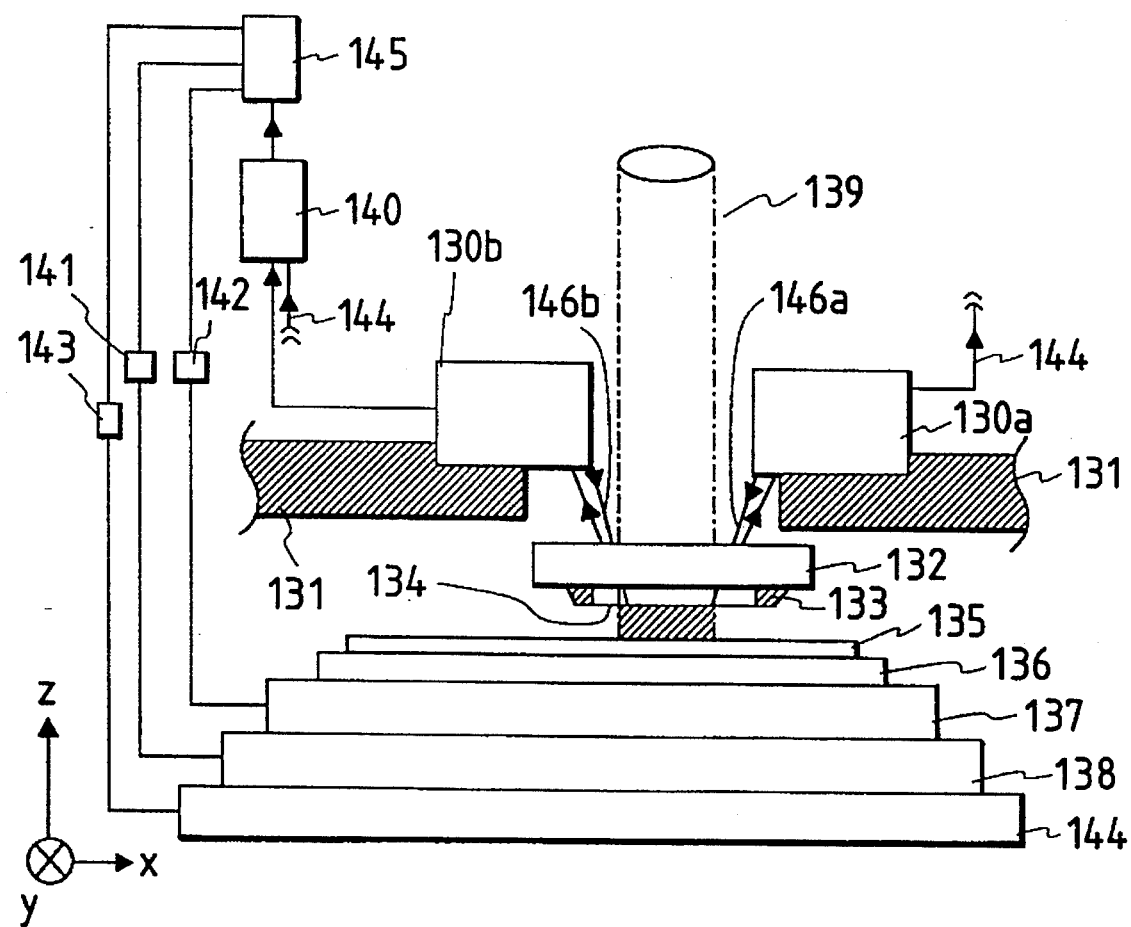
FIG. 4 illustrates schematically an X-ray exposure apparatus of Example 5 of the present invention.

FIG. 4 illustrates schematically an X-ray exposure apparatus of Example 5 of the present invention, employing the X-ray mask structure of any of the above Examples 1 to 4. In FIG. 4, X-ray beams 139 are projected nearly in parallel to the exposure region indicated by chain lines. The numeral 135 indicates a wafer which is covered, for example, with a resist on the surface; 133 a mask frame; 134 a mask membrane on which an X-ray absorption pattern is provided; 132 a mask supporter; 136 a wafer fixing member like a wafer chuck; 137 a Z-axis stage (tiltable practically); 138 an X-axis stage; and 144 a Y-axis stage. Detection function parts for alignment of the mask 134 and the wafer 135 are held in the holders 130a and 130b from which information is obtained regarding the relative spacing and the relative lateral deviation in the XY plane direction.

In FIG. 4, although only two alignment detection function parts 130a, 130b are shown, two more alignment detection function parts are provided corresponding to respective sides of the IC circuit pattern area at the four corners on the mask 134. In the detection function part holders 130a, 130b, the optical system and the detection system shown in FIG. 25 are held.

The signals obtained from the alignment detection function parts are treated with a signal processor 140 to derive the relative lateral deviation in the XY plane and the relative spacing. The driving systems for respective axes 141, 142, 143 are driven to bring the mask and the wafer to the predetermined relative position according to the signal. Then, the X-ray beams 139 are projected.

The X-ray exposure beams 139 are intercepted by an X-ray intercepting member not shown in the drawing until the positional registration of the mask and the wafer is completed. The X-ray source and the X-ray projecting system are not shown in the drawing also. The numerals 146a and 146b indicate alignment detection light projected from the respective alignment system.

FIG. 4 shows a proximity type of X-ray exposure apparatus. The X-ray mask structure is also applicable to optical steppers. In other words, The X-ray mask structure is applicable to a successive movement projection type of exposure apparatus which employs exposure light of i-line ($\lambda$=365 nm), KrF excimer light ($\lambda$=248 nm), ArF excimer light ($\lambda$=193 nm), etc., and a mirror projection type exposure apparatus which are used widely in recent years and expected to be used more than ever.

EXAMPLE 6

Figure 5:
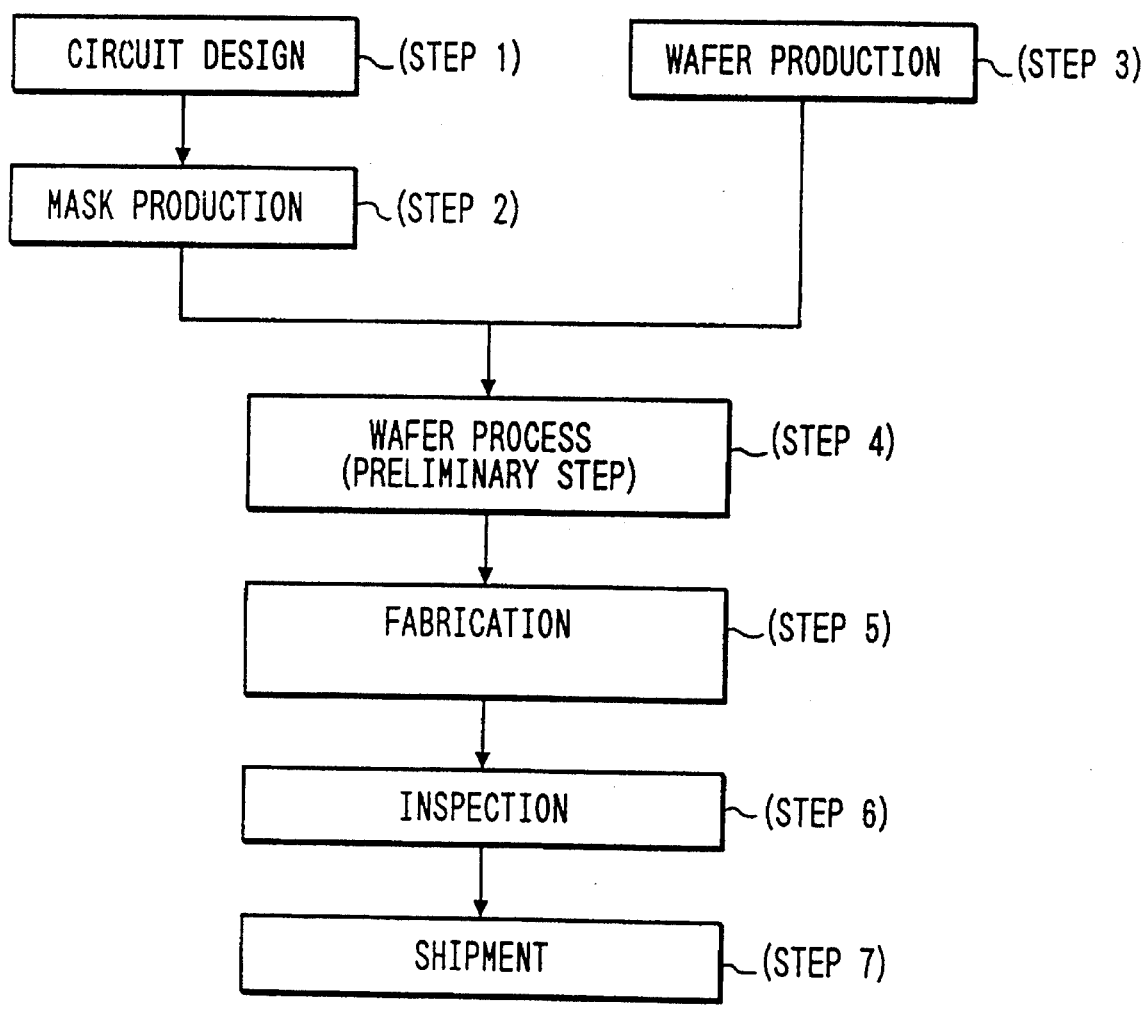
FIG. 5 shows a flow chart of a semiconductor device production method.

An example of the process for producing a semiconductor device by utilizing the above-described light exposure method is explained below. FIG. 5 shows a flow chart of production of a semiconductor device such as semiconductor chips of IC and LSI, liquid crystal panels, and CCD.

In Step 1 (circuit design), a circuit of a semiconductor device is designed. In Step 2 (mask production), a mask is produced having a designed circuit pattern. Separately, in Step 3 (wafer production), a wafer is produced from a material such as silicon.

In Step 4 (wafer process) called a preliminary step, an actual circuit is formed on the wafer with the mask by lithography techniques. In Step 5 (fabrication) a semiconductor is fabricated into chips, and this step includes assemblage (dicing and bonding), packaging (chip sealing), etc. In Step 6 (inspection), tests are conducted for function confirmation, durability, etc. Through these steps a semiconductor device is completed, and is shipped out (Step 7).

Figure 6:
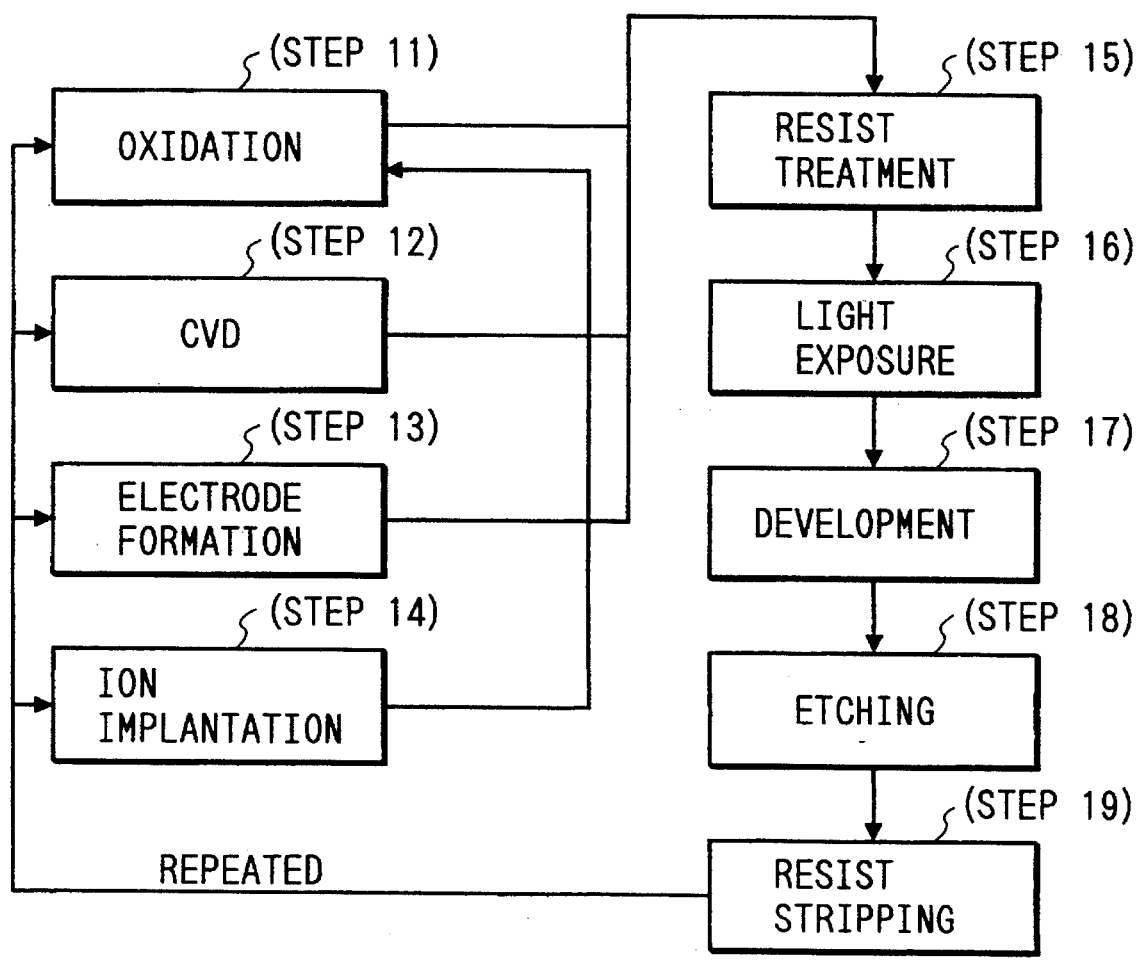
FIG. 6 shows a flow chart of a wafer process.

FIG. 6 shows a detailed flow chart of the above wafer step (Step 4). In Step 11 (oxidation), the surface of the wafer is oxidized. In Step 12 (CVD), an insulation film is formed on the surface of the wafer. In Step 13 (electrode formation), an electrode is formed by vapor deposition. In Step 14 (ion implantation), ions are implanted into the wafer. In Step 15 (resist treatment), a photosensitive material is applied onto the wafer. In Step 16 (exposure), the circuit pattern is transcribed by light exposure by the aforementioned light exposure apparatus. In Step 17 (development), the exposed wafer is developed. In Step 18 (etching), the portion other than the developed resist is etched off. In Step 19 (resist separation), the unnecessary resist after the etching is removed. By repeating the above steps, multiple circuit patterns are formed on the wafer.

As described in this Example, a high integration degree of the semiconductor device which could not be achieved by conventional techniques can be achieved by the constitution of the X-ray mask structure of the present invention.

EXAMPLE 7

Figure 7A:
FIGS. 7A to 7H show schematically a process for producing an X-ray mask structure of Example 7.

As shown in FIG. 7A, a silicon nitride layer 82 is formed in a thickness of 2 μm as the X-ray transmissive film by chemical vapor deposition on a silicon wafer substrate 81.

Figure 7B:
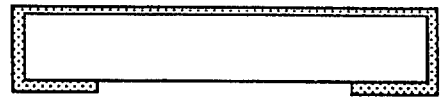

Then, the X-ray transmissive film 82 on one face of the substrate where no absorption pattern will be formed is partly removed by dry etching in a portion which serves later as an X-ray transmitting area as shown in FIG. 7B.

Figure 7C:
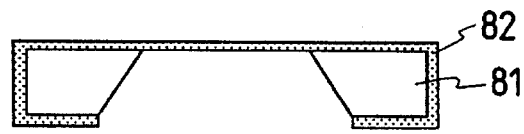

The portion of the silicon where the silicon nitride layer 81 has been removed is etched off with an aqueous potassium hydroxide solution at 100° C. to leave a non-supported silicon nitride film as shown in FIG. 7C.

Figure 7D:
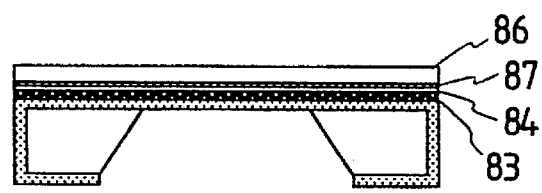

Thereon, a carbon layer 83 in a thickness of 100 nm, a chromium layer 84 in a thickness of 5 nm, and a gold layer 87 in a thickness of 50 nm are successively deposited by electron beam vapor deposition. Further thereon, a chemical amplification type resist layer 86 for an extreme ultraviolet ray is applied in a thickness of 1.0 μm as shown in FIG. 7D.

Figure 7E:
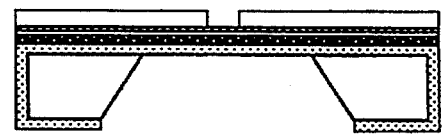

Onto this X-ray mask structure substrate, a pattern which has preliminarily been formed on a reticle is transcribed with an excimer laser stepper of a numerical aperture of 0.5 at a wavelength of 248 nm. By developing the resist, a resist pattern is formed at a resolution of 0.25 μm as shown in FIG. 7E.

Figure 7F:
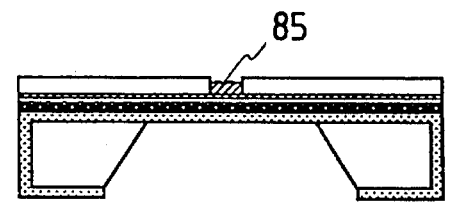

In the gaps in the resist pattern, an X-ray absorption pattern and an alignment pattern 85 of 0.7 μm thick are formed by gold plating with Neutronex-309 (manufactured by EEJA) as the metallizing solution by utilizing the underlying gold layer 87 as the electrode at 50° C. as shown in FIG. 7F.

Figure 7G:
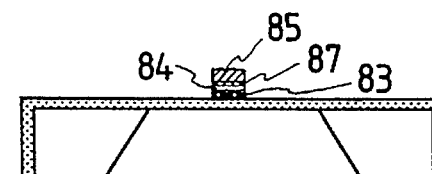

Further, the resist is stripped off by $O_2$-RIE, and the gold layer 87, the chromium layer 84, and the carbon layer 83 are etched successively by Ar-sputtering to form an X-ray mask structure of the present invention as shown in FIG. 7G.

Figure 7H:
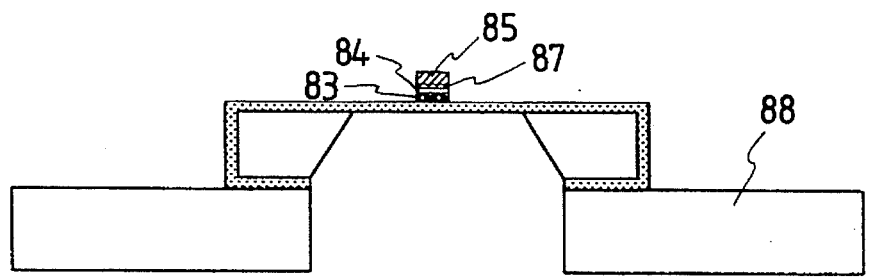

Finally, to make the handling easy, this X-ray mask structure is bonded to a mask frame 88 of Pyrex glass with an epoxy type adhesive as shown in FIG. 7H.

The obtained X-ray mask structure is set on an X-ray exposure apparatus having an optical aligning system, and is registered positionally to the alignment pattern having been formed on a wafer. The output wave form has sufficiently low noise components as shown in FIG. 28B in comparison with that of the Comparative Example shown in FIG. 28A. Therefore the precision of the waveform analysis for the alignment is improved, and consequently the alignment precision is improved.

EXAMPLE 8

Figure 8A:
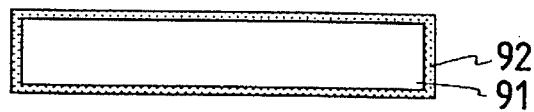
FIGS. 8A to 8H show schematically a process for producing an X-ray mask structure of Example 8.

As shown in FIG. 8A, a silicon carbide layer 92 is formed in a thickness of 2 μm as the X-ray transmissive film by chemical vapor deposition on a silicon wafer substrate 91.

Figure 8B:
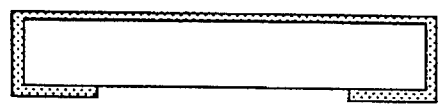

Then, the X-ray transmissive film 92 on one face of the substrate on which no absorption pattern will be formed is partly removed by dry etching in a portion which serves later as an X-ray transmitting area as shown in FIG. 8B.

Figure 8C:

The portion of the silicon where the silicon nitride layer 81 has been removed is etched off with an aqueous 30% potassium hydroxide solution at 100° C. to leave a non-supported silicon nitride film as shown in FIG. 8C.

Figure 8D:
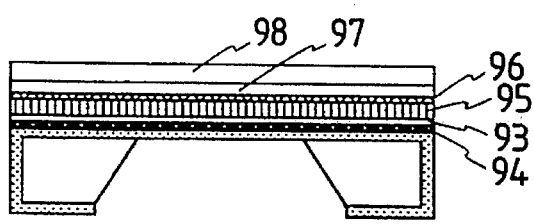

Thereon, a carbon layer 94 of 100 nm thick, a chromium layer 93 of 50 nm thick, a tantalum layer 95 of 700 nm thick, a 5,8-dioxy-1,4-naphthoquinone (naphthazalin) layer 96 of 100 nm thick (absorption maximum wavelength; 625 nm) of dioxyquinone dye as an organic dye layer, and an $SiO_2$ layer 97 of 50 nm thick are successively formed by sputtering, and further thereon, a PMMA layer 98 is applied as an electron beam resist in a thickness of 0.3 µm as shown in FIG. 8D.

Figure 8E:
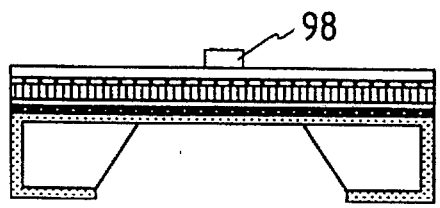
Figure 8F:
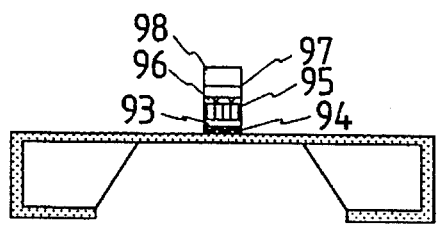
Figure 8G:
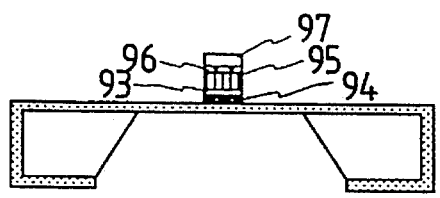
Figure 8H:
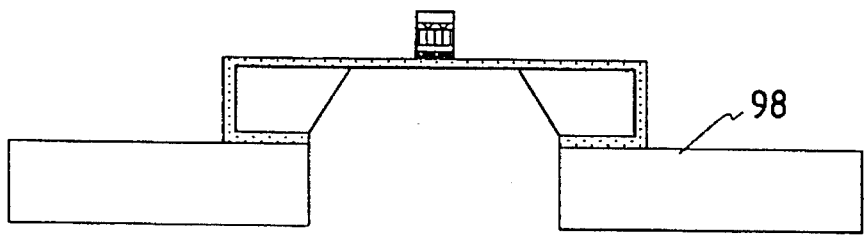

On this substrate, electron beam lithography is conducted with an acceleration voltage of 50 kV. By developing the resist, a resist pattern is formed at a resolution of 0.25 µm as shown in FIG. 8E. The $SiO_2$ layer 97 is dry-etched with this resist pattern as the mask. Further, by use of this $SiO_2$ layer 97 as the mask, the organic dye layer 96, the tantalum layer 95, the chromium layer 93, and the carbon layer 94 are dry-etched as shown in FIG. 8F. Then, the PMMA layer 98 is removed to form an X-ray absorption pattern and an alignment pattern of 0.75 µm thick as shown in FIG. 8G. Thus, an X-ray mask structure of the present invention is prepared.

Finally, to make the handling easy, this X-ray mask structure is bonded to a mask frame 98 of silicon carbide with an epoxy type adhesive.

The obtained X-ray mask structure is set on an X-ray exposure apparatus having an optical aligning system of a He-No laser (632.8 nm), and is registered positionally to the alignment pattern having been formed on a silicon wafer. The output waveform has sufficiently low noise components as shown in FIG. 28B in comparison with that of the Comparative Example shown in FIG. 28A. Therefore, the precision of the waveform analysis for the alignment is improved, and consequently the alignment precision is improved.

EXAMPLE 9

Figure 9A:
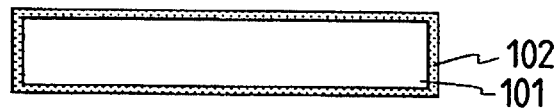
FIGS. 9A to 9H show schematically a process for producing an X-ray mask structure of Example 9.

As shown in FIG. 9A, a silicon nitride layer 102 is formed in a thickness of 2 µm as the X-ray transmissive film by chemical vapor deposition on a silicon wafer substrate 101.

Figure 9B:
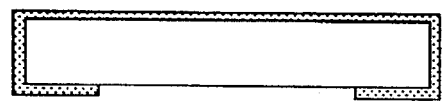

Then, the X-ray transmissive film 102 on one face of the substrate on which no absorption pattern will be formed is partly removed by dry etching in a portion which serves later as an X-ray transmitting area as shown in FIG. 9B.

Figure 9C:
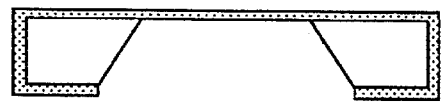

The portion of the silicon where the silicon nitride layer has been removed is etched off with an aqueous 30% potassium hydroxide solution at 100° C. to leave a non-supported silicon nitride film 102 as shown in FIG. 9C.

Figure 9D:
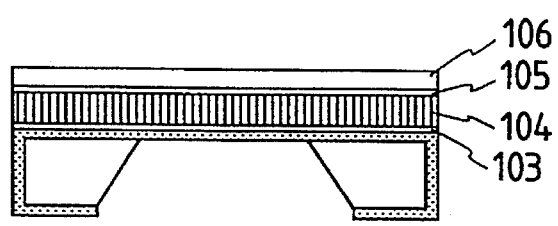

Thereon, a chromium layer 103 of 5 nm thick, a tungsten layer 104 of 750 nm thick, and an $SiO_2$ layer 105 of 50 nm thick are successively formed by sputtering, and further thereon, a PMMA layer 106 is applied as an electron beam resist in a thickness of 0.3 µm as shown in FIG. 9D.

Figure 9E:
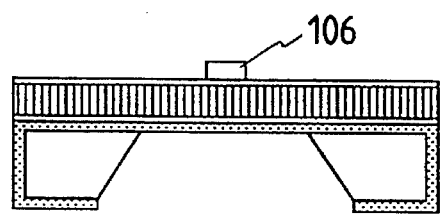
Figure 9F:
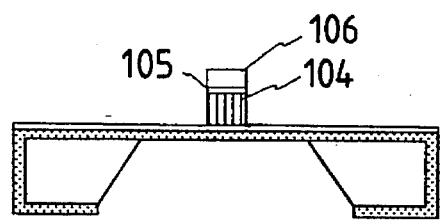

On this substrate, electron beam lithography is conducted with an acceleration voltage of 50 kV. By developing the resist, a resist pattern is formed at a resolution of 0.25 µm as shown in FIG. 9E. The $SiO_2$ layer 105 is dry-etched with this resist pattern as the mask. Further, by use of this $SiO_2$ layer 105 as the mask, the tungsten layer 104 is dry-etched, and the chromium layer 103 is treated for oxidation and transparency by $O_2$-RIE to form an X-ray absorption pattern and an alignment pattern of 0.75 µm thick as shown in FIG. 9F.

Figure 9G:
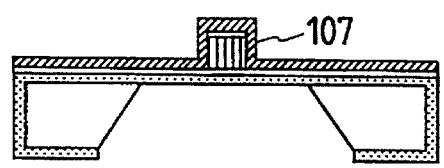

Thereon, a solution of alkyl titanate in alcohol is applied by spinner coating, and the applied matter is heat-treated at 300° C. for 30 minutes to obtain a titanium oxide layer 107 of 80 nm thick as shown in FIG. 9G. Thus, an X-ray mask structure of the present invention is prepared.

Figure 9H:
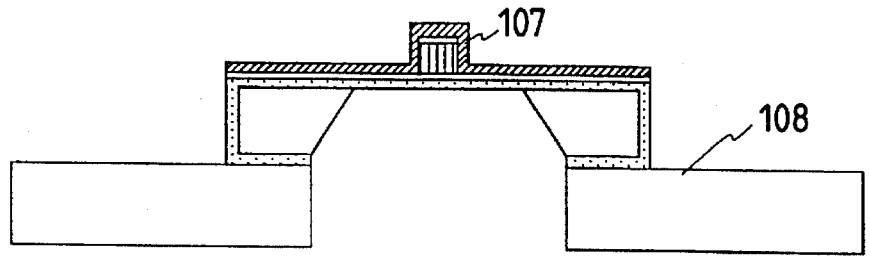

Finally, to make the handling easy, this X-ray mask structure is bonded to a mask frame 108 of titanium alloy with an epoxy type adhesive as shown in FIG. 9H.

The obtained X-ray mask structure is set on an X-ray exposure apparatus having an optical aligning system of a laser diode (785 nm), and is registered positionally to the alignment pattern having been formed on a silicon wafer. The output waveform of the output signal at the alignment detection system has sufficiently low noise components as shown in FIG. 28B in comparison with that of the Comparative Example shown in FIG. 28A. Therefore, the precision of the waveform analysis for the alignment is improved, and consequently the alignment precision is improved.

EXAMPLE 10

Figure 10A:
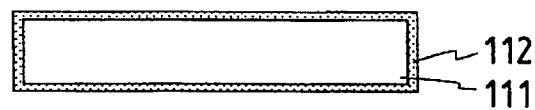
FIGS. 10A to 10H show schematically a process for producing an X-ray mask structure of Example 10.

As shown in FIG. 10A, a silicon nitride layer 112 is formed in a thickness of 2 µm as the X-ray transmissive film by chemical vapor deposition on a silicon wafer substrate 111.

Figure 10B:
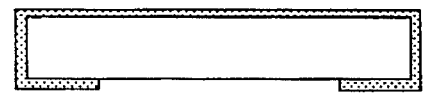

Then, the X-ray transmissive film 112 on one face of the substrate on which no absorption pattern will be formed is partly removed by dry etching in a portion which serves later as an X-ray transmitting area as shown in FIG. 10B.

Figure 10C:
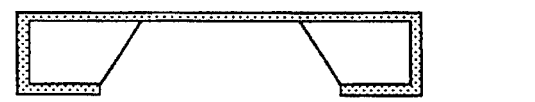

The portion of the silicon where the silicon nitride layer has been removed is etched off with an aqueous 30% potassium hydroxide solution at 100° C. to leave a non-supported silicon nitride layer 112 as shown in FIG. 10C.

Figure 10D:
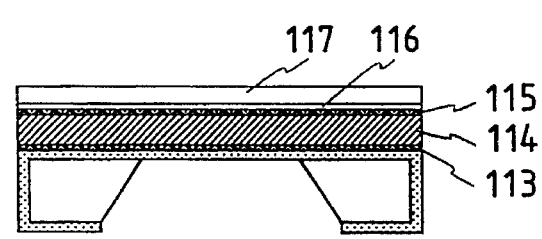

Thereon, a ZnSe layer 113 of 80 nm thick, a tungsten layer 114 of 750 nm thick, a ZnSe layer 115 of 80 nm thick, and an $SiO_2$ layer 116 of 50 nm thick are successively formed by sputtering, and further thereon, an extreme ultraviolet resist layer 117 is applied in a thickness of 0.3 µm as shown in FIG. 10D.

Figure 10E:
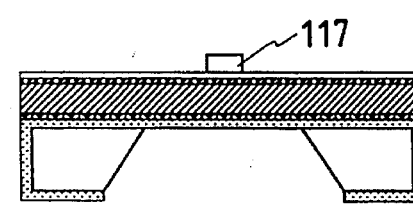
Figure 10F:
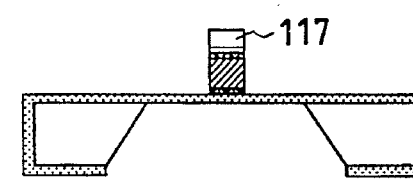
Figure 10G:
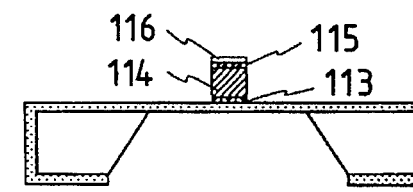

This substrate is exposed to light of 248 nm projected through a preliminarily prepared reticle with an excimer laser stepper having an optical projecting system of a numerical aperture of 0.5. By developing the resist, a resist pattern is formed at a resolution of 0.25 µm as shown in FIG. 10E. The $SiO_2$ layer 116 is dry-etched with this resist pattern as the mask. Further, by use of this $SiO_2$ layer 116 as the mask, the ZnSe layer 113, the tungsten layer 114, and the ZnSe layer 115 are dry-etched respectively as shown in FIG. 10F, and the resist layer 117 is completely removed to form an X-ray absorption pattern and an alignment pattern of 0.75 µm thick as shown in FIG. 10G. Thus, an X-ray mask structure of the present invention is prepared.

Figure 10H:
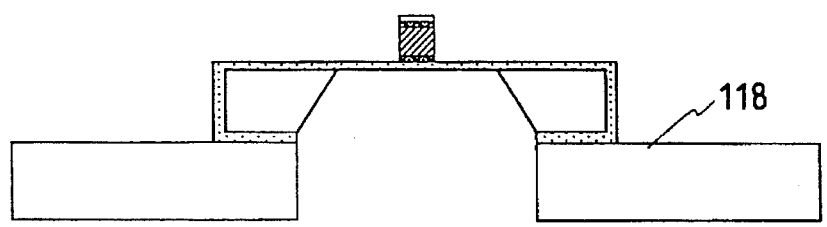

Finally, to make the handling easy, this X-ray mask structure is bonded to a mask frame 118 of Pyrex glass with an epoxy type adhesive as shown in FIG. 10H.

The obtained X-ray mask structure is set on an X-ray exposure apparatus having an optical aligning system of a laser diode (830 nm), and is registered positionally to the alignment pattern having been formed on a silicon wafer. The output waveform of the output signal at the alignment detection system has sufficiently low noise components as shown in FIG. 28B in comparison with that of the Comparative Example shown in FIG. 28A. Therefore, the precision of the waveform analysis for the alignment is improved, and consequently the alignment precision is improved.

EXAMPLE 11

Figure 11A:
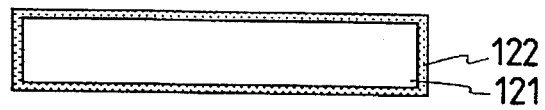
FIGS. 11A to 11H show schematically a process for producing an X-ray mask structure of Example 11.

As shown in FIG. 11A, a silicon nitride layer 122 is formed in a thickness of 2 µm as the X-ray transmissive film by chemical vapor deposition on a silicon wafer substrate 121.

Figure 11B:
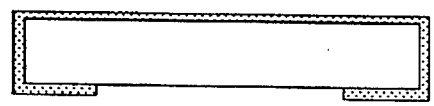

Then, the X-ray transmissive film 122 on one face of the substrate on which no absorption pattern will be formed is partly removed by dry etching in a portion which serves later as an X-ray transmitting area as shown in FIG. 11B.

Figure 11C:
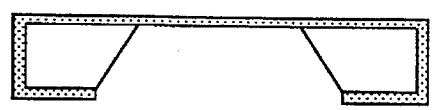

The portion of the silicon where the silicon nitride layer has been removed is etched off with an aqueous 30% potassium hydroxide solution at 100° C. to leave a non-supported silicon nitride layer 122 as shown in FIG. 11C.

Figure 11D:
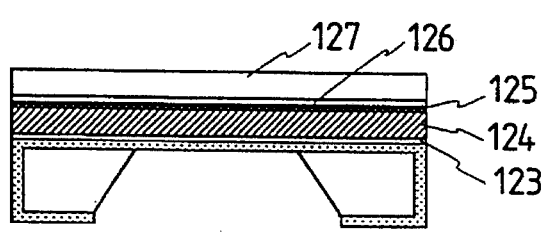

Thereon, a chromium layer 123 of 5 nm thick, a tungsten layer 124 of 750 nm thick, a CdS layer 125 of 61 nm thick, and an SiO$_2$ layer 126 of 50 nm thick are successively formed by sputtering, and further thereon, an extreme ultraviolet resist layer 127 is applied in a thickness of 0.3 µm as shown in FIG. 11D.

Figure 11E:
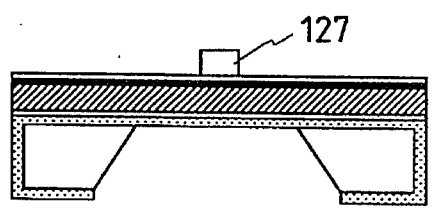
Figure 11F:
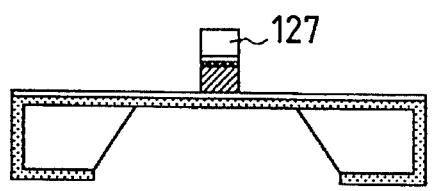
Figure 11G:
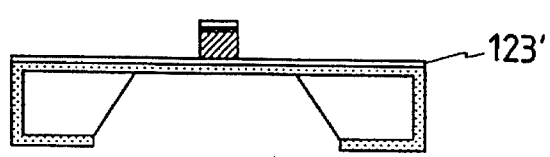

This substrate is exposed to light of 248 nm projected through a preliminarily prepared reticle with an excimer laser stepper having an optical projecting system of a numerical aperture of 0.5. By developing the resist, a resist pattern is formed at a resolution of 0.25 µm as shown in FIG. 11E. The SiO$_2$ layer 126 is dry-etched with this resist pattern as the mask. Further, by use of this SiO$_2$ layer as the mask, the CdS layer 125 and the tungsten layer 124 are dry-etched respectively as shown in FIG. 11F, and the resist layer 127 is completely stripped. Then, the chromium layer 123 is treated for oxidation and transparency to form an X-ray absorption pattern and an alignment pattern of 0.75 µm thick as shown in FIG. 11G. Thus, an X-ray mask structure of the present invention is prepared.

Figure 11H:
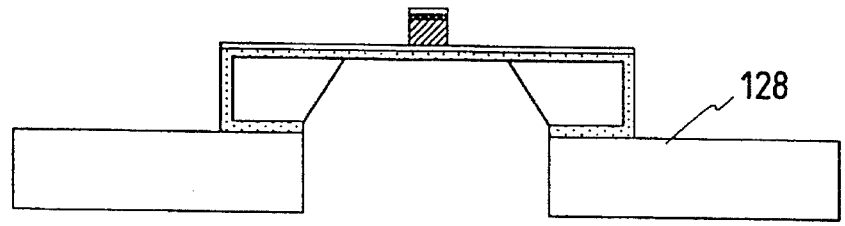

Finally, to make the handling easy, this X-ray mask structure is bonded to a mask frame 128 of Pyrex glass with an epoxy type adhesive as shown in FIG. 11H.

The obtained X-ray mask structure is set on an X-ray exposure apparatus having an optical aligning system of a laser diode (632.8 nm), and is registered positionally to the alignment pattern having been formed on a silicon wafer. The output waveform of the output signal at the alignment detection system has sufficiently low noise components as shown in FIG. 28B in comparison with that of the Comparative Example shown in FIG. 28A. Therefore, the precision of the waveform analysis for the alignment is improved, and consequently precision of the alignment is improved.

EXAMPLE 12

Figure 12A:
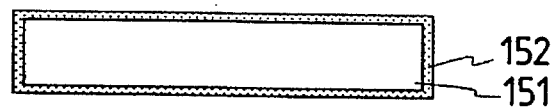
FIGS. 12A to 12H show schematically a process for producing an X-ray mask structure of Example 12.

As shown in FIG. 12A, a silicon carbide layer 152 serving both as the X-ray transmissive film and a light scattering prevention film is formed in a thickness of 1736 nm so as to meet the conditions of prevention of alignment light reflection by chemical vapor deposition on a silicon wafer substrate 151.

Figure 12B:
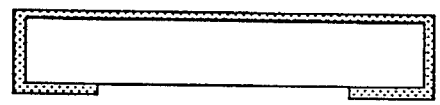

Then, the X-ray transmissive film 152 on one face of the substrate on which no absorption pattern will be formed is partly removed by dry etching in a portion which serves later as an X-ray transmitting area as shown in FIG. 12B.

Figure 12C:
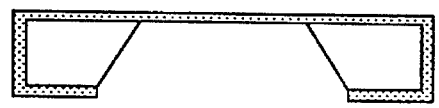

The portion of the silicon where the silicon carbide layer has been removed is etched off with an aqueous 30% potassium hydroxide solution at 100° C. to leave a non-supported silicon carbide layer 152 as shown in FIG. 12C.

Figure 12D:
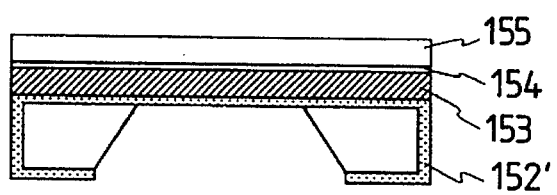

Thereon, a tungsten layer 153 of 750 nm thick, and an SiO$_2$ layer 154 of 50 nm thick are successively formed by sputtering, and further thereon, a PMMA layer 155 is applied in a thickness of 0.3 µm as shown in FIG. 12D.

Figure 12E:
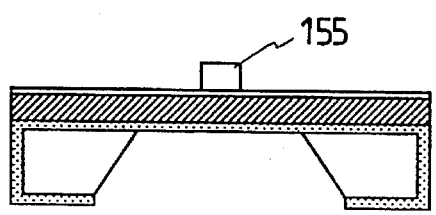
Figure 12F:
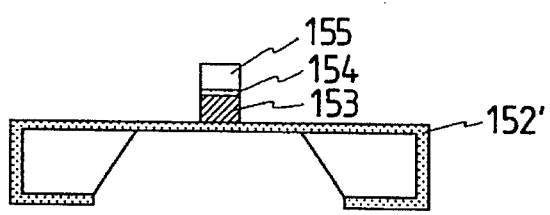
Figure 12G:
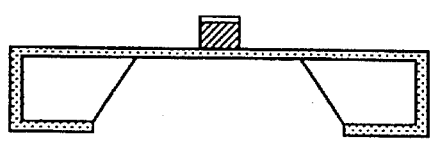

On this substrate, electron beam lithography is conducted at an acceleration voltage of 50 kV. By developing the resist, a resist pattern is formed at a resolution of 0.15 µm as shown in FIG. 12E. The SiO$_2$ layer 154 is dry-etched with this resist pattern as the mask. Further, by use of this SiO$_2$ layer as the mask, the tungsten layer 153 is dry-etched as shown in FIG. 12F, and the resist layer 155 is completely removed to form an X-ray absorption pattern and an alignment pattern of 0.75 µm thick as shown in FIG. 12G. Thus, an X-ray mask structure of the present invention is prepared.

Figure 12H:
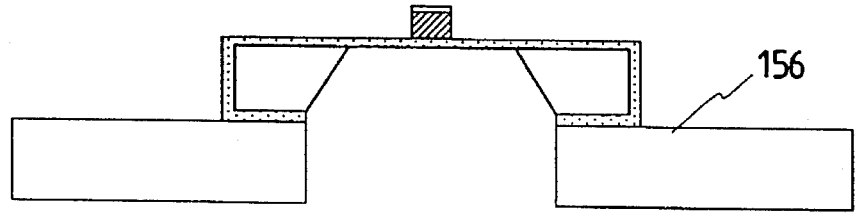

Finally, for ease of handling on an exposure apparatus, this X-ray mask structure is bonded to a mask frame 156 of silicon carbide with an epoxy type adhesive as shown in FIG. 12H.

The obtained X-ray mask structure is set on an X-ray exposure apparatus having an optical aligning system of a laser diode (785 nm), and is registered positionally to the alignment pattern having been formed on a silicon wafer. The output waveform of the output signal at the alignment detection system has sufficiently low noise components as shown in FIG. 28B in comparison with that of the Comparative Example shown in FIG. 28A. Therefore, the precision of the waveform analysis for the alignment is improved, and consequently precision of the alignment is improved.

EXAMPLE 13

Figure 13A:
FIGS. 13A to 13H show schematically a process for producing an X-ray mask structure of Example 13.

As shown in FIG. 13A, a silicon nitride layer 162 is formed in a thickness of 2 µm as the X-ray transmissive film by chemical vapor deposition on a silicon wafer substrate 161.

Figure 13B:

Then, the X-ray transmissive film 162 on one face of the substrate on which no absorption pattern will be formed is partly removed by dry etching in a portion which serves later as an X-ray transmitting area as shown in FIG. 13B.

Figure 13C:

The portion of the silicon where the silicon nitride layer has been removed is etched off with an aqueous 30% potassium hydroxide solution at 100° C. to leave a non-supported silicon nitride layer 162 as shown in FIG. 13C.

Figure 13D:
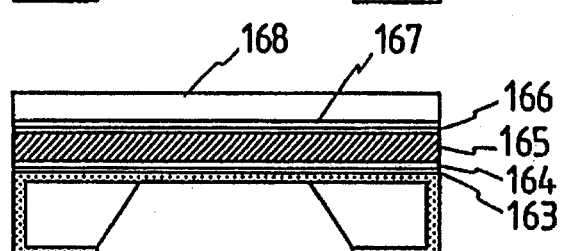

Thereon, a carbon layer 163 of 50 nm thick, a chromium layer 164 of 5 nm thick, a tungsten layer 165 of 750 nm thick, a ZnSe layer 166 of 75 nm thick, and an SiO$_2$ layer 167 of 50 nm thick are successively formed by sputtering, and further thereon, an extreme ultraviolet resist layer 168 is applied in a thickness of 0.3 µm as shown in FIG. 13D.

Figure 13E:
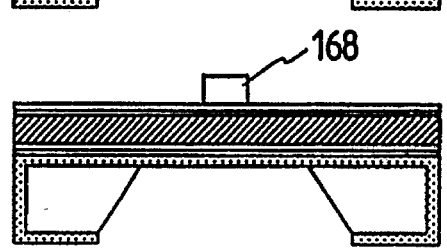
Figure 13F:
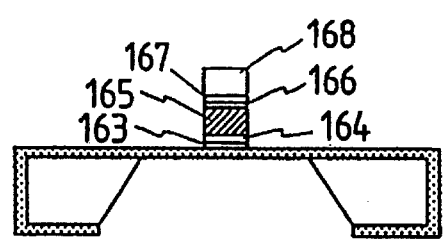
Figure 13G:
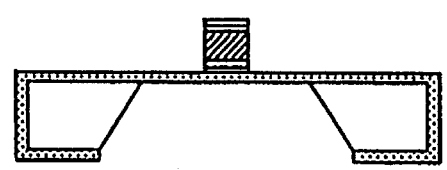

This substrate is exposed to light of 248 nm projected through a preliminarily prepared reticle with an excimer laser stepper having an optical projecting system of a numerical aperture of 0.5. By developing the resist, a resist pattern is formed at a resolution of 0.25 µm as shown in FIG. 13E. The SiO$_2$ layer 167 is dry-etched with this resist pattern as the mask. Further, by use of this SiO$_2$ layer as the mask, the ZnSe layer 166, the tungsten layer 165, the chromium layer 164, and the carbon layer 163 are dry-etched respectively as shown in FIG. 13F, and the resist layer 168 is completely removed to form an X-ray absorption pattern and an alignment pattern of 0.75 μm thick as shown in FIG. 13G. Thus, an X-ray mask structure of the present invention is prepared.

Figure 13H:
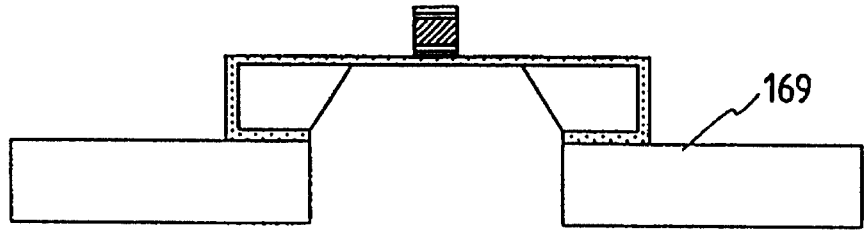

Finally, for ease of handling on the light exposure apparatus, this X-ray mask structure is bonded to a mask frame 169 of Pyrex glass with an epoxy type adhesive as shown in FIG. 13H.

The obtained X-ray mask structure is set on an X-ray exposure apparatus having an optical aligning system of a laser diode (785 nm), and is registered positionally to the alignment pattern having been formed on a silicon wafer. The output waveform of the output signal at the alignment detection system has sufficiently low noise components as shown in FIG. 28B in comparison with that of the Comparative Example shown in FIG. 28A. Therefore, the precision of the waveform analysis for the alignment is improved, and consequently precision of the alignment is improved.

COMPARATIVE EXAMPLE 1

A mask structure of this Comparative Example is explained by reference to FIGS. 22A to 22H.

As shown in FIG. 7A, a silicon nitride layer 42 is formed in a thickness of 2 μm as the X-ray transmissive film by chemical vapor deposition on a silicon wafer 41.

Figure 22A:
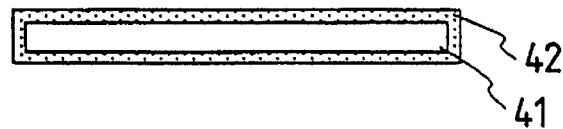
FIGS. 22A to 22H show schematically another conventional process for producing an X-ray mask structure.
Figure 22B:

Then, as shown in FIG. 22B, the silicon nitride layer on one face of the substrate on which no absorption pattern will be formed is partly removed by dry etching in a portion which serves later as an X-ray transmitting area, and the portion of the silicon where the silicon nitride layer 81 has been removed is etched off with an aqueous 30% potassium hydroxide solution at 100° C. to leave a non-supported silicon nitride film.

Figure 22C:
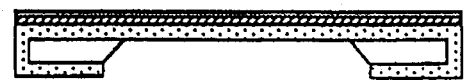

A chromium layer 43 in a thickness of 5 nm, and a gold layer 44 in a thickness of 50 nm are successively deposited as the electrode by electron beam vapor deposition as shown in FIG. 22C.

Figure 22D:
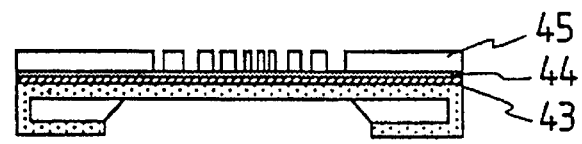

Further thereon, an extreme ultraviolet type resist layer 45 is applied in a thickness of 1.0 μm. Onto this wafer, a pattern which has preliminarily been formed on a reticle is transcribed with an excimer laser stepper of a numerical aperture of 0.5 at a wavelength of 248 nm. By developing the resist, a resist pattern is formed at a resolution of 0.25 μm as shown in FIG. 22D.

Figure 22E:
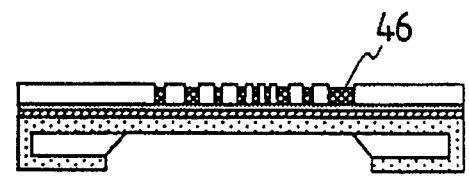

In the gaps of the resist pattern, an X-ray absorption pattern and an alignment pattern 46 of 0.65 μm thick are formed with Neutronex-309 (manufactured by EEJA) as the metallizing solution by gold plating by use of the underlying gold layer 44 as the electrode at 50° C. as shown in FIG. 22E.

Figure 22F:

Further, the resist is stripped off by $O_2$-RIE, the gold layer 44 is etched by Ar sputtering, and the chromium layer is treated for oxidation and transparency by $O_2$-RIE as shown in FIG. 22F.

Figure 22G:
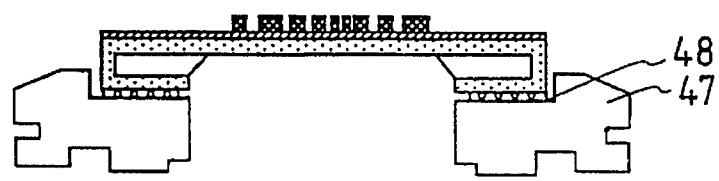

Finally, for ease of handling, this X-ray mask structure is bonded to a mask frame 47 of Pyrex glass with an epoxy type adhesive 48 as shown in FIG. 22G.

Figure 22H:
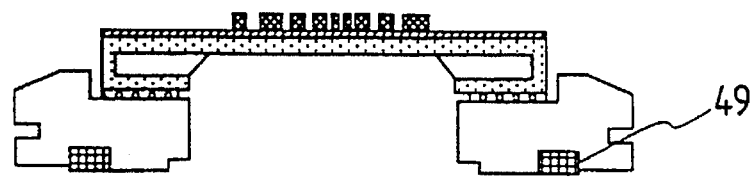
Figure 23A:
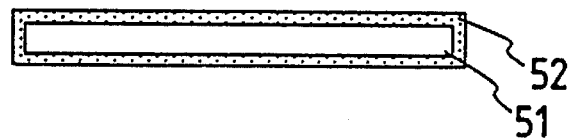
FIGS. 23A to 23H show still another conventional process for producing an X-ray mask structure.
Figure 23B:
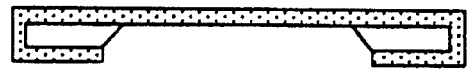
Figure 23C:
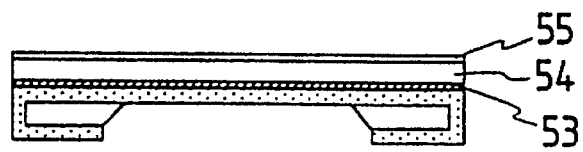
Figure 23D:
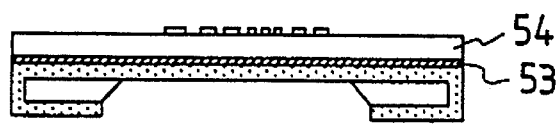
Figure 23E:
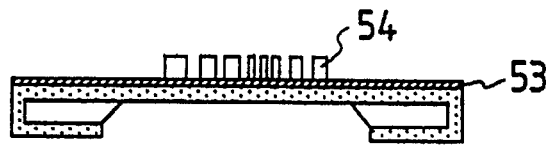
Figure 23F:
Figure 23G:
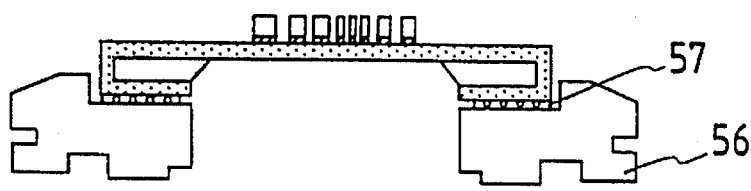
Figure 23H:
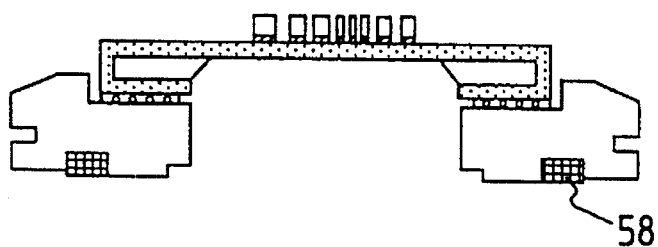

So as to hold the X-ray mask structure with a magnetic chuck on the X-ray exposure apparatus, a magnetic body 49 was further bonded to the mask frame 56 as shown in FIG. 22H.

The obtained X-ray mask is set on an X-ray exposure apparatus (FIG. 24) having an optical aligning system shown in FIG. 25, and is registered positionally to the alignment pattern having been formed on a wafer. The output waveform has noises in addition to the alignment signal as shown in FIG. 28A. Consequently, the precision of the waveform analysis for the alignment is low, and precision of the alignment is low.

EXAMPLE 14

The X-ray exposure apparatus and the method of exposure with the X-ray mask structure is described by reference to FIG. 24 and FIG. 25.

Figure 24:
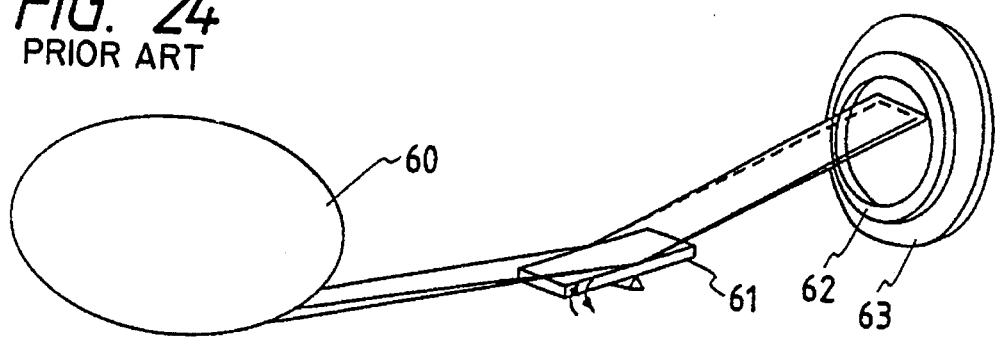
FIGS. 24 and 25 show the principle of positional registration of an X-ray mask structure with a wafer by an X-ray exposure apparatus.

In FIG. 24, the X-ray emitted from a synchrotron light source 60 is spread by an X-ray reflection mirror 61, and is projected to an X-ray mask structure 62 of the present invention fixed on a mask stage of an X-ray exposure apparatus. The X-ray absorption pattern formed on the X-ray mask structure 62 is transcribed onto a wafer 63 placed as close as 30 μm to the X-ray mask structure 62. On the wafer 63, an alignment pattern is marked preliminarily, and on the alignment pattern, an x-ray resist is applied in a thickness of about 1 μm.

The X-ray mask structure 62 of the present invention and the wafer 63 are registered by detecting positional deviation by an optical aligning system (FIG. 25) mounted on the X-ray exposure apparatus from the alignment pattern on the X-ray mask structure 62 and the alignment pattern on the wafer, and driving the wafer stages (not shown in the drawing) holding the wafer according to the detected deviation.

The registration of the X-ray mask structure 62 to the wafer 63 is specifically described by reference to FIG. 25.

In FIG. 25, the light beam emitted from a semiconductor laser 16 or the like is converted to a parallel light flux by a collimator lens 17. The parallel light flux is projected through a projection lens 18, a mirror 19 for deflection, and a filter 20 to physical optical detection elements 24, 25, 26, 27 for detection of relative lateral deviations of the X-ray mask structure 22 and the wafer 23 which are placed in an X-ray exposed area 21 and physical optical detection elements 28, 29, 30, 31 for detection of relative spacing thereof.

The diffracted light from the physical optical elements, which contains information on the relative lateral deviation of the mask 22 from the wafer 23 and the relative spacing between them, passes through the filter 20, and is focused by a light-receiving lens 32 on a light-receiving face of a sensor 33.

The sensor 33 comprises two line sensors 33a and 33b. The line sensor 33a receives the signal on the relative lateral deviation of the X-ray mask structure 22 from wafer 23. The line sensor 33b receives a signal on the relative spacing between the X-ray mask structure 22 and the wafer 23.

The output from the sensor 33 is noiseless as shown in FIG. 28B in comparison with the output of a sensor shown in FIG. 28A of a conventional apparatus owing to the X-ray mask structure of the present invention employed in this X-ray exposure apparatus. The wave form in FIG. 28B has less noise components owing to less scattered light in comparison with FIG. 28A, whereby the wave analysis for determination of a gravity center position of the peak can be conducted with high precision.

As described above, the X-ray exposure apparatus employing the X-ray mask structure of the present invention is superior in precision of alignment, and enables high precision of X-ray exposure in semiconductor device production. The relative lateral deviation and the relative spacing between the X-ray mask structure may also be measured by optical heterodyne interference with a linear diffraction grating or a checker grating as the measuring physical optical element.

EXAMPLE 15

The production of a semiconductor device employing an X-ray mask structure of the present invention is described by reference to FIG. 5 and FIG. 6.

FIG. 5 shows a flow chart of production of a semiconductor device (e.g., a semiconductor chip such as IC and LSI, a liquid crystal panel, CCD, and the like). In Step 1 (Circuit design), the circuit of the semiconductor device is designed. In Step 2 (Mask production), a mask is produced which has the designed circuit pattern. Separately, in Step 3 (Wafer production), a wafer is produced from silicon or another material.

In Step 4 (Wafer process) called a preliminary step, an actual circuit is formed on the above prepared wafer by use of the above mask by lithography. In subsequent Step 5 (Assemblage), semiconductor chips are prepared from the wafer prepared in Step 4. Step 5 includes an assembling process (dicing, and bonding), packaging process (chip enclosing), and so forth. In Step 6 (Inspection), the operation characteristics and endurance properties of the prepared semiconductor device are confirmed by testing. The semiconductor device is completed by these steps, and shipped out (Step 7).

FIG. 6 shows a detailed flow chart of the aforementioned wafer process (Step 4). In Step 11 (Oxidation), the surface of the wafer is oxidized. In Step 12 (CVD), an insulation film is formed on the surface of the wafer surface. In Step 13 (Electrode formation), electrodes are formed on the wafer by vapor deposition. In Step 14 (Ion implantation), ions are implanted onto the wafer. In Step 15 (Resist processing), a photosensitive material is applied on the wafer. In Step 16 (Light exposure), a circuit pattern of the X-ray mask structure is printed on the wafer by light exposure by the aforementioned light exposure apparatus. In Step 17 (Development), the wafer exposed to light is developed. In Step 18 (Etching), the portion of the resist material other than the developed resist image portion is etched off. In Step 19 (Resist stripping), unnecessary resist after the etching is stripped off. By repeating such processes, circuit patterns are formed in multiple layers.

According to this Example, a high integration degree of semiconductor devices which could not previously be achieved can be obtained.

EXAMPLE 16

Figure 14A:
FIGS. 14A to 14H show schematically a process for producing an X-ray mask structure of Example 16.

FIGS. 14A to 14H are schematic sectional views showing a process for producing an X-ray mask structure of this Example. In FIG. 14A, the substrate 301, usually an Si wafer, is a member for constructing a supporting frame for the X-ray transmissive film.

Firstly, an SiC film was formed as an X-ray transmissive film 302 in a thickness of 2 μm by chemical vapor deposition (CVD) on the substrate (Si wafer) 301. The formed X-ray transmissive film 302 of SiC had a refractive index n=2.62.

Figure 14B:
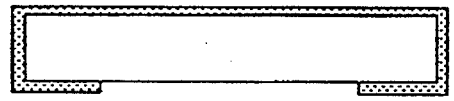
Figure 14C:

A portion of the SiC on one face of the substrate was eliminated partly by dry etching for the later formation of the X-ray transmissive area as shown in FIG. 14B. Then, the portion of the substrate 301 where X-ray transmissive film 302 had been eliminated was etched off with an aqueous 30% potassium hydroxide solution at 100° C. to form a supporting frame as shown in FIG. 14C.

On the top face of the X-ray transmissive film, a flat coating film 303 of CdS (n=2.6) was formed in a thickness of 120 nm as a light-scattering prevention film by sputtering.

On the flat coating film 303, a tungsten film 304 was formed in a thickness of 750 nm as an X-ray absorbing layer by sputtering. Further, on the X-ray absorbing layer 304, a CdS layer 305 of 61 nm thick, and an $SiO_2$ layer 306 of 50 nm thick were formed by sputtering.

Figure 14D:
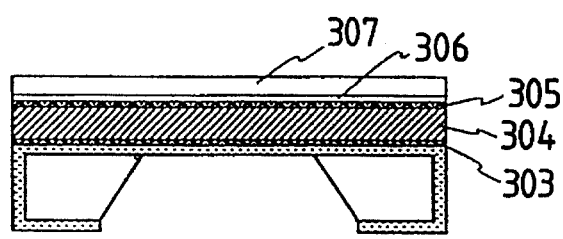
Figure 14E:
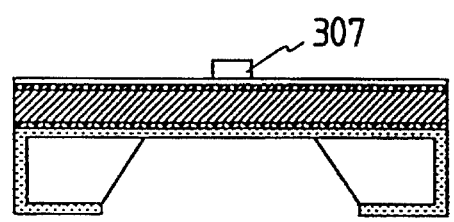

On the $SiO_2$ layer, a chemical amplification type of extreme ultraviolet resist 307 was applied in a thickness of 0.3 μm as shown in FIG. 14D. This substrate was exposed to light of 248 nm projected by an excimer laser stepper of a numerical aperture of 0.5 through a preliminarily prepared reticle, and the resist was developed to form a resist pattern at a resolution of 0.25 nm as shown in FIG. 14E.

Figure 14F:
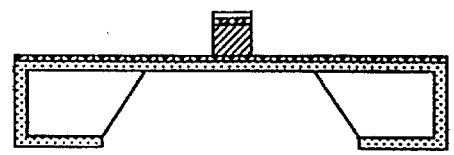

By using this resist pattern as the mask, the $SiO_2$ layer 306 was etched off. Further, by using the etched $SiO_2$ layer as the mask, the CdS layer 305 and the tungsten layer 304 were dry-etched. After the etching treatments, the $SiO_2$ layer was eliminated by hydrofluoric acid to form an X-ray absorbing layer and an alignment pattern of 0.75 thick as shown in FIG. 14F.

Figure 14G:
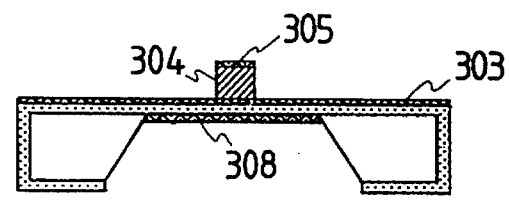
Figure 14H:
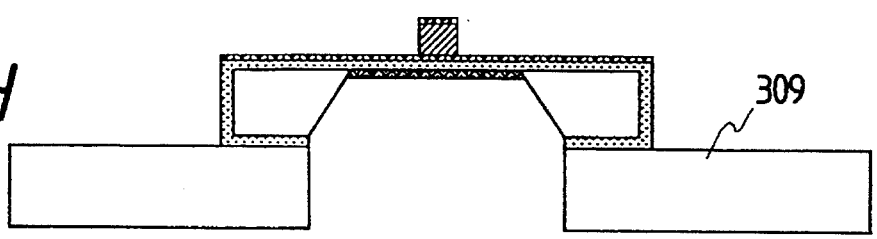

Finally, as shown in FIG. 14G, on the back face of the X-ray transmissive film 302, a CdS film 308 was formed in a thickness of 120 nm as the flat coating film for scattering prevention by sputtering in the same manner as the flat coating film 303 of CdS. Thus, an X-ray mask structure was prepared which had a flat scattering prevention film 303, 308 respectively on both faces of the X-ray transmissive film 302, and the CdS layer 305 as the reflection prevention film on the tungsten pattern. This mask structure may be used by bonding to a mask frame 309 as shown in FIG. 14H.

The above X-ray mask structure was used for positional registration of the mask to a wafer on a light exposure apparatus as shown in FIG. 25. Consequently, scattered light emitted from the surface of the X-ray absorbent film and the reflected light of the alignment light from the top face of the X-ray absorption pattern were both reduced, whereby highly precise registration could be achieved with less noise of the signal.

EXAMPLE 17

An SiC film was formed as an X-ray transmissive film 302 in a thickness of 2 μm by chemical vapor deposition (CVD) on the substrate (Si wafer) 301. The formed X-ray transmissive film 302 of SiC had a refractive index n=2.62.

A portion of the SiC on one face of the substrate was eliminated partly by dry etching for the later formation of the X-ray transmissive area as shown in FIG. 14B. Then, the portion of the substrate 301 where X-ray transmissive film 302 had been eliminated was etched off with an aqueous 30% potassium hydroxide solution at 100° C. to form a supporting frame as shown in FIG. 14C.

The surface roughness of both faces of the X-ray transmissive film was measured with an optical type roughness tester. The maximum height (p-v value) of the top face was 18 nm and that of the back face was 6 nm.

With this result, flat coating films 303 of CdS (n=2.6) were formed in a thickness of 30 nm on the top face of the X-ray transmissive film 302, and in a thickness of 10 nm on the back face thereof by sputtering as light-scattering prevention films.

On the flat coating film 303 on the top face, a tungsten film 304 was formed in a thickness of 750 nm as an X-ray absorbing layer 304 by sputtering. Further, on the X-ray absorbing layer 304, a CdS layer 305 of 61 nm thick, and an SiO$_2$ layer 306 of 50 nm thick were formed by sputtering.

On the SiO$_2$ layer, a chemical amplification type of extreme ultraviolet resist 307 was applied in a thickness of 0.3 µm as shown in FIG. 14D. This substrate was exposed to light of 248 nm projected by an excimer laser stepper of a numerical aperture of 0.5 through a preliminarily prepared reticle, and the resist was developed to form a resist pattern at a resolution of 0.25 nm as shown in FIG. 14E.

By using this resist pattern as the mask, the SiO$_2$ layer 306 was etched off. Further, by using the etched SiO$_2$ layer as the mask, the CdS layer 305 and the tungsten layer 304 were dry-etched. After etching treatments, the SiO$_2$ layer was eliminated by hydrofluoric acid to form an X-ray absorbing layer and an alignment pattern of 0.75 thick as shown in FIG. 14F.

Finally, as shown in FIG. 14G, on the back face of the X-ray transmissive film 302, a CdS film 308 was formed in a thickness of 120 nm as the flat coating film for scattering prevention by sputtering in the same manner as the flat coating film 303 of CdS. Thus, an X-ray mask structure was prepared which had a flat scattering prevention film 303, 308 respectively on both faces of the X-ray transmissive film 302, and the CdS layer 305 as the reflection prevention film on the tungsten pattern. This mask structure may be used by bonding to a mask frame 309 as shown in FIG. 14H.

The above X-ray mask structure was used for positional registration of the mask to a wafer on a light exposure apparatus as shown in FIG. 25. Consequently, scattered light emitted from the surface of the X-ray absorbent film and the reflected light of the alignment light from the top face of the X-ray absorption pattern were both reduced, whereby highly precise registration could be achieved with less noise of the signal.

EXAMPLE 18

The CdS film, a light-scattering prevention film, was subjected to analysis of internal structure of the film with an X-ray diffraction apparatus. Consequently, no X-ray diffraction pattern of a crystal structure of the films was detected, which shows that the film had an amorphous internal structure. Therefore, it was considered that this light-scattering prevention film caused less light scattering owing to the absence of crystal grains in comparison with a crystalline thin film having inherently crystal grains at the surface.

EXAMPLE 19

Figure 15:
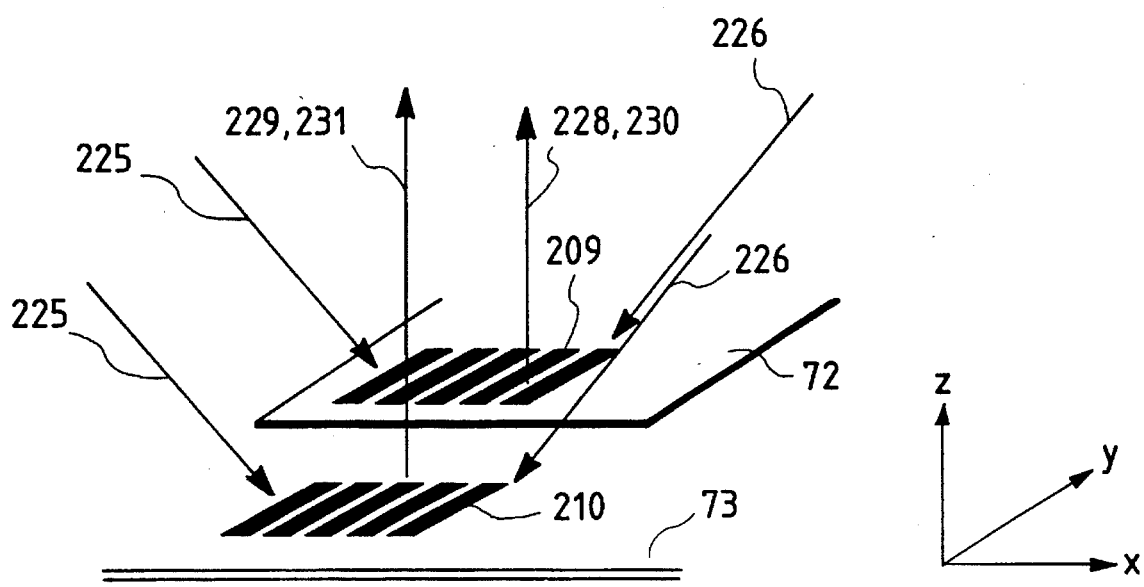
FIGS. 15 to 17 show the principle of positional registration of a mask to a wafer.
Figure 16:
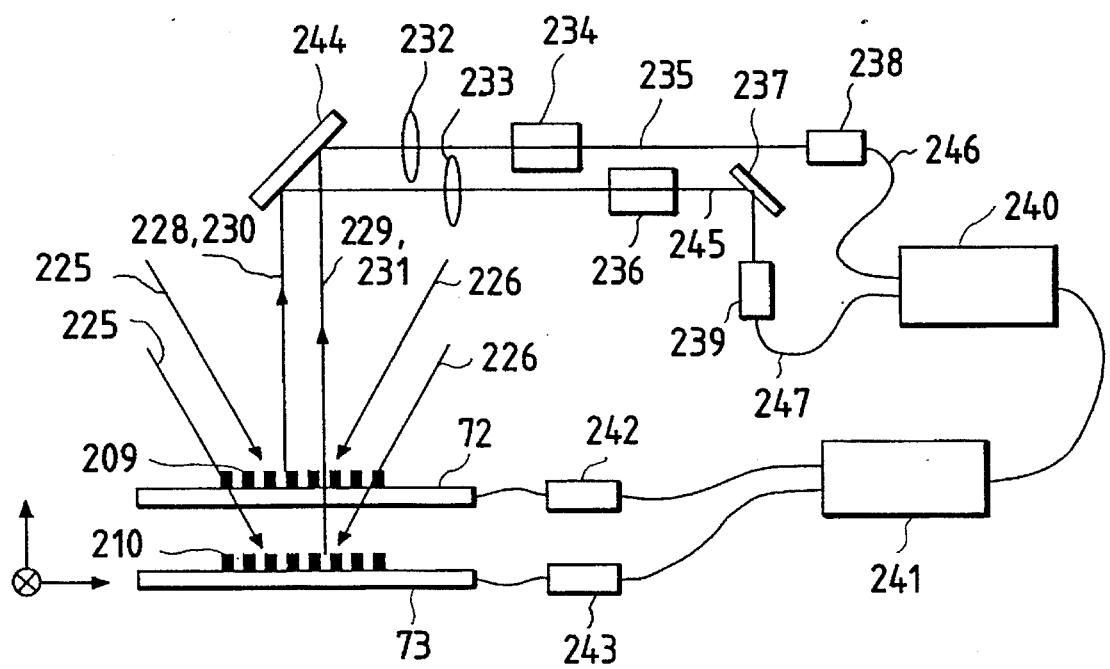
Figure 17:
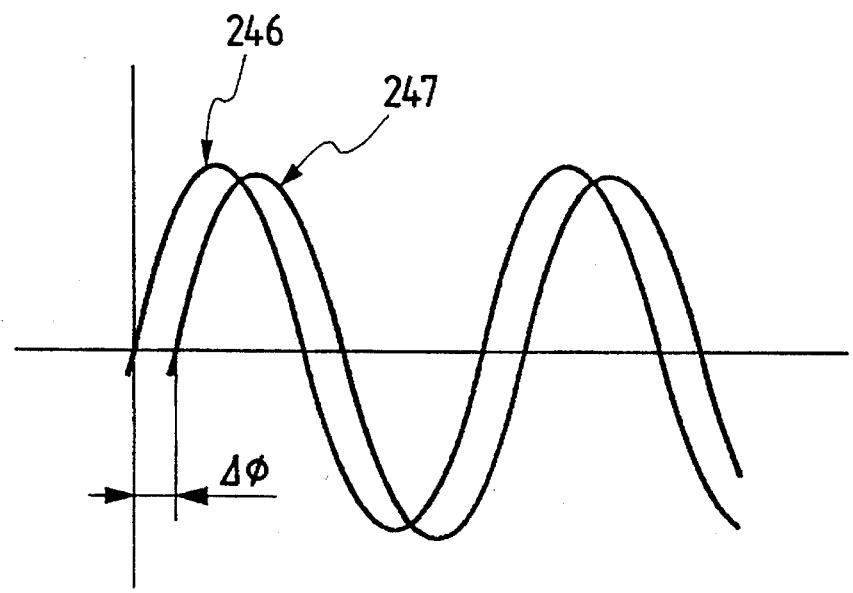

The X-ray mask structures described in Examples 1 to 4 were used in the registration apparatus shown in FIGS. 15 to 17 for registration of the mask on the wafer. The principle of the registration is described by reference to FIGS. 15 to 17.

Coherent light beams 225, 226 having slightly different frequencies from each other are introduced onto a linear diffraction grating 209 on the mask 72 and another diffraction grating 210 on the wafer 73. FIG. 16 shows the mask and the wafer in FIG. 15 viewed at a different angle. In FIG. 16, the linear diffraction grating 209 emits a diffraction light beam 228 of the projected light beam 225 and light beam 230 of the projected light 226. Here, the diffracted light beam 228 and the diffracted light beam 230 are on one and the same optical axis. Similarly, the linear diffraction grating 210 emits diffraction light beam 229 of the projected light beam 225 and light beam 231 of the projected light 226, and the diffracted light beam 229 and the diffracted light beam 231 are on one and the same optical axis. These diffracted light beams 228, 229, 230, 231 are deflected by a mirror 244, pass through lenses 232, 233, and the polarization plates 234, 236. The polarization planes of the respective diffracted light beams 229, 231 are made coincident by polarization plates 234, 236 into coherent light 235. The coherent light 235 is introduced in an optical sensor 238. Similarly, the diffracted light beams 228, 230 are converted to coherent light 245, which is deflected by a mirror 237, and is introduced to an optical sensor 239. The mask 72 and the optical sensor 239 are conjugated through the lens 233. The wafer 73 and the optical sensor 238 are conjugated through the lens 232. The coherent light beams 235, 245 are photoelectrically transduced into beat signals 246, 247 shown in FIG. 17. The phase difference between the beat signals 246, 247 is measured by a phase difference detector 240. This phase difference corresponds to the relative deviation between the mask 72 and the wafer 73. The required movement for correction of the relative positional deviation of the mask 72 and the wafer 73 is calculated by a position controller 241, and the relative position between the mask 72 and the wafer 73 is adjusted by actuators 242, 243. The linear diffraction gratings 209, 210 arranged on the X-ray mask structure described in Examples 1 to 4 improve the S/N ratio of the beat signals 246, 247, and enable positional registration of the mask on the wafer in high precision.

The beat signals L$_1$ and L$_2$ are given by Equations (2) and (3) below:

$$L_1 = a_1 + b_1 \cdot \cos\{2\pi(f_2-f_1)t + 4\pi x_1/P\} \tag{2}$$

$$L_2 = a_2 + b_2 \cdot \cos\{2\pi(f_2-f_1)t + 4\pi x_2/P\} \tag{3}$$

where $f_1$ and $f_2$ are oscillation frequencies of the coherent light beams 225, 226 respectively; P is the pitch of the linear diffraction gratings 209, 210; $x_1$, and $x_2$ are deviations from the standard position of the linear diffraction gratings 209, 210 respectively; $a_1$ and $a_2$ are amplitudes of DC components; and $b_1$ and $b_2$ are amplitudes of beat signals.

The relative positional deviation between the mask 72 and the wafer 73 is shown as a function of the phase difference $\Delta\phi$ between the beat signals 246, 247 obtained by the phase difference detector 240 as shown by Equation (4) below:

$$x_2 - x_1 = P1 \cdot \Delta\phi/4\pi \tag{4}$$

The positions of the mask 72 and the wafer 73 are adjusted by the actuator 242, 243 to decrease this value.

EXAMPLE 20

Figure 18:
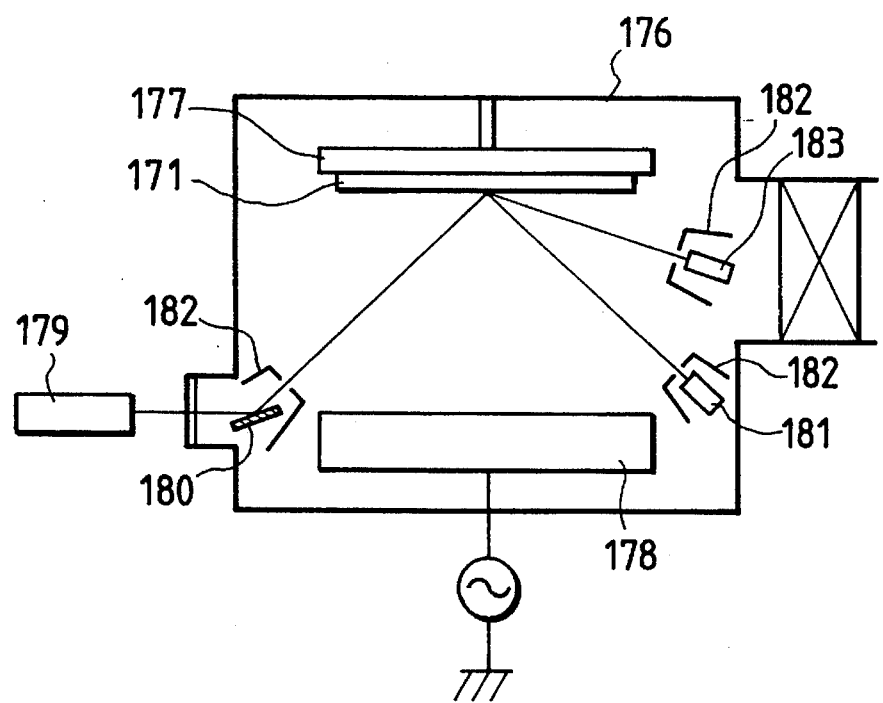
FIGS. 18 to 20 show a method of forming a light-scattering prevention film.
Figure 19:
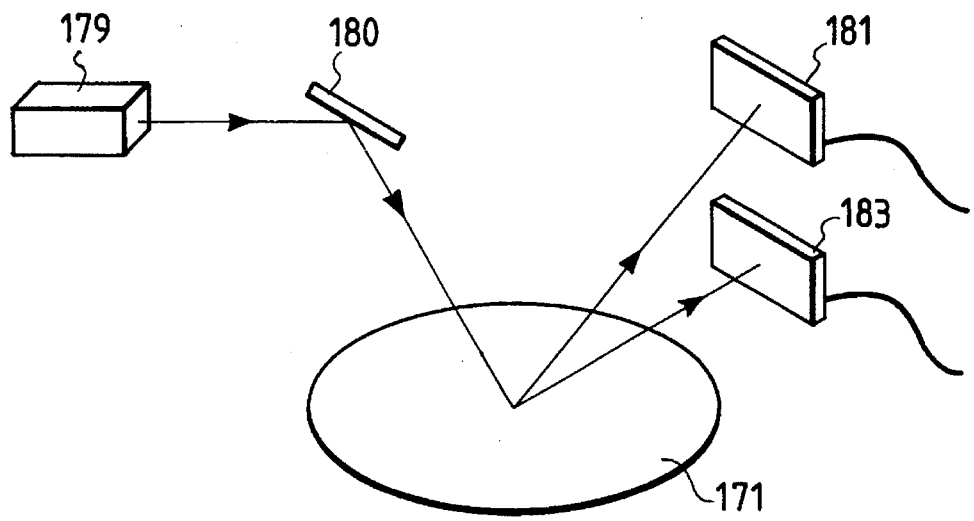
Figure 20:
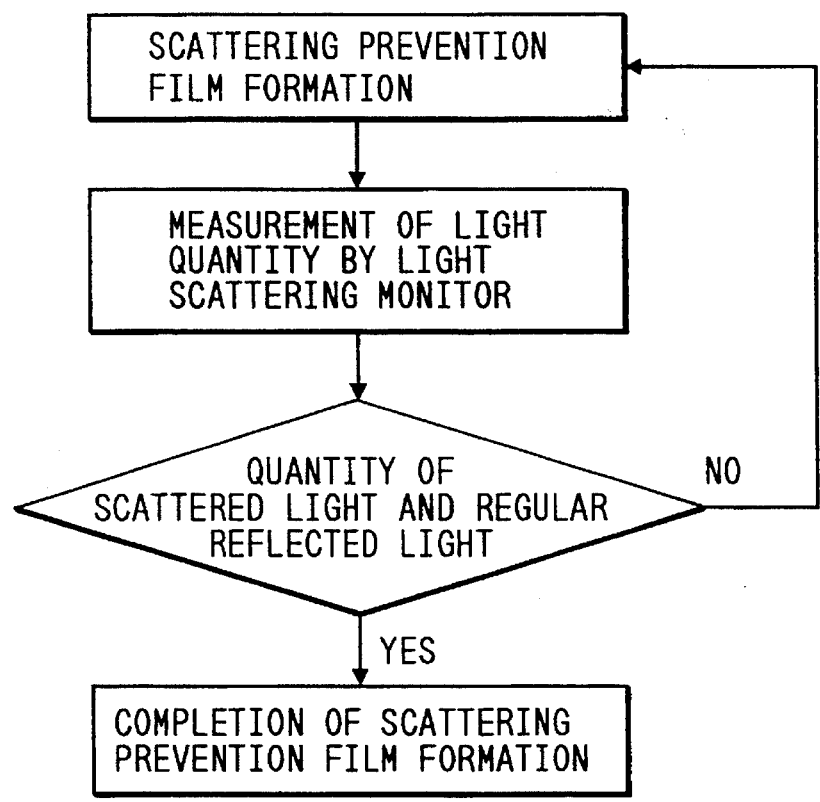
Figure 21A:
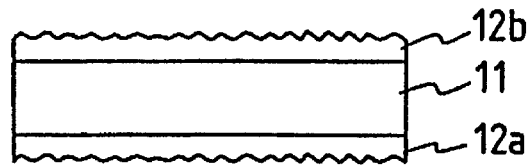
FIGS. 21A to 21G show schematically a conventional process for producing an X-ray mask structure.
Figure 21B:
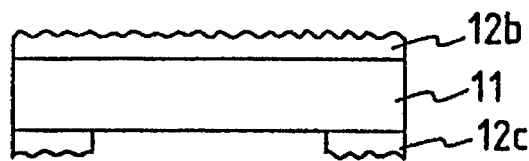
Figure 21C:
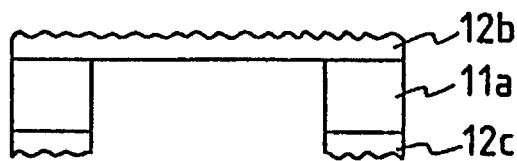
Figure 21D:
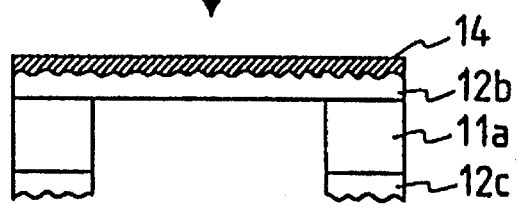
Figure 21E:
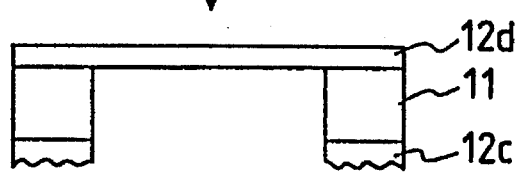
Figure 21F:
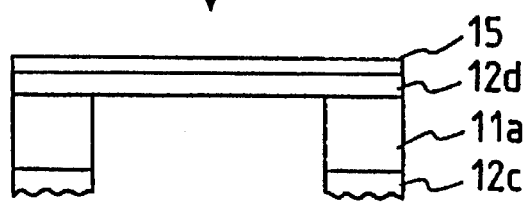
Figure 21G:
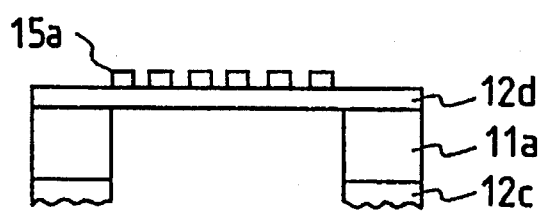

This Example shows a process for forming the scattering prevention film on the X-ray mask structure described in Examples 7 to 11 by reference to FIGS. 18 to 20.

FIG. 18 illustrates a production apparatus for the scattering prevention film of the X-ray mask structure. In FIG. 18, the numeral 176 denotes a chamber for plasma CVD (chemical vapor deposition synthesis), and the numeral 178 denotes an electrode. A substrate 171 for formation of an X-ray mask structure is held by a sample holder 177. In the plasma CVD chamber 176, a monitor mechanism is provided for monitoring the state of the scattering prevention film during the film formation. The monitor mechanism is constituted from a laser 179, a deflection mirror 180, optical detectors 181, 183, and the mirror 180 and the optical detectors 181, 183 are protected by protection members 182. The laser light beam emitted from the laser 179 is deflected by the deflection mirror 180, passes through the protection member 182, and is projected at a predetermined angle to the substrate 171 of the X-ray mask structure during film formation. The regular reflection light at the X-ray mask structure formation substrate 171 passes through the protection member 182, and is introduced to the optical sensor 181. The scattered light at the X-ray mask structure formation substrate 171 passes through the protection member 182, and is introduced to the optical sensor 183. On the basis of the light intensity signals from the optical detectors 181, 183, the film is formed in a manner that the amount of the quantity of the scattered light is minimum. For instance, the film formation is stopped at the time when the reflectivity has come to approximately zero from the light intensity distribution obtained by the optical detector 181 and the scattered light intensity detected by the optical detector 183 has come to the minimum. Thereby the amount of scattered light at the surface of the X-ray mask structure surface is reduced at the time of alignment.

FIG. 19 shows another embodiment of the monitor mechanism for monitoring the state of the scattering prevention film during the film formation. The monitor for the film formation state may be provided independently of the plasma CVD chamber as shown in FIG. 19, while the monitor system in FIG. 18 is provided in the plasma CVD chamber. In FIG. 19, the laser light beam emitted from the laser 179 is deflected by the deflection mirror 180, and is projected at a predetermined angle to the substrate 171 of the X-ray mask structure during scattering prevention film formation. The regular reflection light at the X-ray mask structure substrate 171 during the film formation is introduced to the optical sensor 181. The scattered light at the X-ray mask structure formation substrate 171 is introduced to the optical sensor 183. On the basis of the light intensity signals from the optical detectors 181, 183, the film is formed in a manner that the amount of the quantity of the scattered light is minimum. For instance, the film formation is stopped at the time when the reflectivity has come to approximately zero from the light intensity distribution obtained by the optical detector 181 and the scattered light intensity detected by the optical detector 183 has come to the minimum. Thereby the amount of scattered light at the surface of the X-ray mask structure surface is reduced at the time of alignment.

FIG. 20 shows the flow chart of the process for scattering prevention film with the film formation monitor illustrated in FIG. 19.

As described above, the process of formation of a scattering prevention film of the present invention enables reduction of scattered light at the surface of the X-ray transmissive film or the pattern for X-ray mask structure, and alignment with high precision, in particular, enables reduction of noise components of a measurement signal on registration of the mask to the wafer, and registration with high precision to realize fine lithography.

What is claimed is:

1. An X-ray mask structure for X-ray lithography, comprising:

a pattern;

an X-ray transmissive film for holding the pattern;

a frame for supporting the X-ray transmissive film; and a light-scattering prevention film formed on at least a part of the surface of the X-ray transmissive film, wherein the light scattering prevention film is formed on at least one of a top face and a back face of the X-ray transmissive film and has a refractive index substantially equal to the refractive index of the X-ray transmissive film.

2. The X-ray mask structure according to claim 1, wherein the light scattering prevention film reduces scattering of incident light on the surface of the X-ray transmissive film.

3. The X-ray mask structure according to claim 1, further comprising an anti-reflection coating film formed on the surface of the light scattering prevention film to reduce surface reflection of incident light on the light scattering prevention film.

4. The X-ray mask structure according to claim 1, wherein the light scattering prevention film has a refractive index ranging ±10% of the refractive index of the X-ray transmissive film.

5. The X-ray mask structure according to claim 1, wherein the light scattering prevention film has an amorphous structure.

6. The X-ray mask structure according to claim 1, wherein the light scattering prevention film has a thickness larger than a surface roughness of the X-ray transmissive film.

7. An X-ray mask structure for X-ray lithography, comprising:

a pattern;

an X-ray transmissive film for holding the pattern;

a frame for supporting the X-ray transmissive film; and a light scattering prevention film formed on the pattern.

8. The X-ray mask structure according to claim 7, wherein the light reflection prevention film has a refractive index n given by:

$$n=[n_0+\{k_0^2/(n_0-1)\}]^{1/2}$$

wherein $n_0$ is a real number portion of complex refractive index of a material constituting the pattern, and $k_0$ is an imaginary number portion thereof.

9. The X-ray mask structure according to claim 1 or claim 7, wherein the light scattering prevention film is a material used for preventing scattering of alignment light in X-ray lithography employing the X-ray mask structure.

10. The X-ray mask structure according to claim 1 or claim 7, wherein the pattern comprises an X-ray absorbent pattern and an alignment mark pattern.

11. An X-ray exposure apparatus, which comprises an X-ray source, and the X-ray mask structure of claim 1 or claim 7, and conducts transcription of the pattern formed on the X-ray mask structure onto a transcription-receiving member by projecting X-rays through the X-ray mask structure to the transcription-receiving member.

12. An X-ray exposure method, comprising transcribing a pattern on the X-ray mask structure of claim 1 or claim 7 onto a transcription-receiving member by projecting X-rays through the X-ray mask structure onto the transcription-receiving member.

13. A semiconductor device produced by a process comprising transcribing a pattern onto a transcription-receiving member formed on a substrate by the X-ray exposure method of claim 12, and subsequently working the substrate.

14. A process for producing an X-ray mask structure, comprising steps of:

forming a flat coating film having a refractive index substantially the same as that of an X-ray transmissive film on at least one of a top face and a back face of the X-ray transmissive film; and forming a pattern at least on the top face of the X-ray transmissive film.

15. A process according to claim 14, wherein the flat coating film is a light-scattering prevention film formed by monitoring light scattering.

* * * * *

UNITED STATES PATENT AND TRADEMARK OFFICE
CERTIFICATE OF CORRECTION

PATENT NO. : 5,553,110
DATED : September 3, 1996
INVENTOR(S) : KOICHI SENTOKU ET AL.

It is certified that error appears in the above-indentified patent and that said Letters Patent is hereby corrected as shown below:

ON THE COVER PAGE:

Under "FOREIGN PATENT DOCUMENTS," item [56]

"0237613" should read --2-237613--;
"4130712" should read --4-130712--;
"4309212" should read --4-309212--;
"4372112" should read --4-372112--;
"5315228" should read --5-315228--;
"5315229" should read --5-315229--.

IN THE DISCLOSURE:

COLUMN 10:

Line 45, "x-ray" should read --X-ray--.

UNITED STATES PATENT AND TRADEMARK OFFICE
CERTIFICATE OF CORRECTION

PATENT NO. : 5,553,110
DATED : September 3, 1996
INVENTOR(S) : KOICHI SENTOKU ET AL.

It is certified that error appears in the above-indentified patent and that said Letters Patent is hereby corrected as shown below:

COLUMN 17:

Line 30, "He-No laser" should read --He-Ne laser--.

COLUMN 22:

Line 59, "less" should read --fewer--.

Signed and Sealed this

Twenty-fifth Day of February, 1997

Attest:

BRUCE LEHMAN

Attesting Officer

Commissioner of Patents and Trademarks